United States Patent [19]

Bickford et al.

[11] Patent Number: 5,028,983
[45] Date of Patent: Jul. 2, 1991

[54] MULTILEVEL INTEGRATED CIRCUIT PACKAGING STRUCTURES

[75] Inventors: Harry R. Bickford, Ossining, N.Y.; Mark F. Bregman, Ridgefield, Conn.; Thomas M. Cipolla, Hopewell Junction, N.Y.; John Gow, III, Milton, Vt.; Peter G. Ledermann, Pleasantville; Ekkehard F. Miersch, Mamaroneck, both of N.Y.; Leonard T. Olson, Centerville, Va.; David P. Pagnani, Apalachin, N.Y.; Timothy C. Reiley, Los Gatos, Calif.; Uh-Po E. Tsou, Essex Junction, Vt.; Walter V. Vilkelis, Poughkeepsie, N.Y.

[73] Assignee: International Business Machines Corporation, Armonk, N.Y.

[21] Appl. No.: 263,835

[22] Filed: Oct. 27, 1988

[51] Int. Cl.⁵ .................................................. H01L 23/48
[52] U.S. Cl. ................................. 357/69; 357/68; 357/70; 357/71
[58] Field of Search ........................ 357/68, 69, 70, 71

[56] References Cited

U.S. PATENT DOCUMENTS

| | | |
|---|---|---|
| 3,628,105 | 12/1971 | Sakai . |
| 3,684,818 | 8/1972 | Netherwood ............ 357/69 |
| 3,751,292 | 8/1973 | Kongable . |
| 4,047,132 | 9/1977 | Krajewski . |
| 4,064,552 | 12/1977 | Angelucci et al. . |
| 4,151,546 | 4/1979 | Kawagai et al. . |
| 4,296,456 | 10/1981 | Reid . |
| 4,538,210 | 8/1985 | Schaller . |
| 4,551,746 | 11/1985 | Gilbert et al. . |
| 4,551,747 | 11/1985 | Gilbert et al. . |
| 4,553,111 | 11/1985 | Barrow . |
| 4,560,962 | 12/1985 | Barrow . |
| 4,621,278 | 11/1986 | Miura . |
| 4,674,808 | 6/1987 | Phy .............................. 439/68 |
| 4,736,235 | 4/1988 | Henry ........................... 357/69 |

FOREIGN PATENT DOCUMENTS 0199289 4/1986 European Pat. Off. .

OTHER PUBLICATIONS

IBM Tech. Bul., vol. 26, No. 3B, Aug. 1983, pp. 1490-1492 Ward.
IBM, TDB, vol. 10, No. 10-Mar., 1968 "Mount For Semiconductor Device"-Frei & Moser, A.

Primary Examiner—Edward J. Wojciechowicz
Attorney, Agent, or Firm—Daniel P. Morris

[57] ABSTRACT

Electronic device packaging structures useful for electrically interconnecting an electronic device to a substrate. The structure contains at least two metallization layers with dielectric layers between adjacent to metallization layers. The dielectric layers can have variable thickness. Beam leads can project inwardly in cantilevered fashion over a central aperture through the dielectric layers. The inner ends of the beam leads lie substantially in one plane and can be bonded to contact pads on integrated circuit electronic devices. Beam leads can project outwardly from the metallization layers over outer edges of the dielectric layers for bonding to contact pads on a substrate. Signal leads on metallization layers can be symmetrically arranged between ground and voltage leads to provide optimal impedance properties. These structures are useful for tape automated bonding applications.

24 Claims, 17 Drawing Sheets

MULTILEVEL INTEGRATED CIRCUIT PACKAGING STRUCTURES

FIELD OF THE INVENTION

The present invention relates to electronic packaging structures and, more particularly, is concerned with multilevel metal structures which electrically interconnect an electronic device to a substrate, wherein beam leads are arranged to selectively adjust impedance characteristics and to maximize the number of electrical connections to the electronic device.

BACKGROUND OF THE INVENTION

In the microelectronics industry there is a continuing desire to electrically mount to substrates, such as printed circuit boards, increased lead-count, faster switching-speed VLSI (very large scale integration) integrated circuit (IC) devices by structures which reduce the cost of manufacture of electronic components. In the past, electronic devices were surface mounted to substrates by techniques such as individually wire bonding a device contact pad to a substrate contact pad. Tape Automated Bonding (TAB) was later developed to eliminate the need for individual wire bonding. In TAB a metallic layer is fabricated into a pattern of beam leads. The beam leads can be fabricated on a flexible dielectric film which holds the leads together, or in the absence of a dielectric film, the beam leads are held together by parts of the metallic layer which interconnect the beam leads, the interconnecting parts being removed subsequent to bonding the leads to an electronic device.

As the IC circuit density increases, generally the IC input/output (I/O) count increases, requiring an increased beam lead count for electrical connection thereto. Increased circuit count is generally achieved by a decrease in size of the component devices of the circuits. This size decrease generally results in increased circuit switching speed. Waveforms of circuits having fast switching speed are more susceptible to distortion from the signal line impedance than are waveforms of slower switching speed circuits.

One technique to attain a high number of electrical interconnections to an IC and at the same time provide some impedance adjustment to avoid waveform distortion is to mount the IC onto a multilevel ceramic packaging substrate which has a plurality of metal layers. Some of these layers can be used to reduce the problem of waveform distortion. The ceramic substrate can then be mounted onto a printed circuit board.

Although the ceramic substrate may solve some of these problems, these substrates are very costly to fabricate. In addition, the automated bonding capability provided by a TAB-type tape fabrication technique is lost. Ceramic substrates have to be individually handled for bonding to IC and printed circuit boards.

Alternatively, a multilevel metal TAB tape can be used for bonding to an IC.

U.S. Pat. No. 4,064,552 to Angelucci et al. shows a multilevel metal TAB-type tape structure which is fabricated as shown in FIG. 5 thereof. Two tapes are used. Each tape has a single metal layer on a dielectric layer. The sides of the dielectric layer of each tape without a metal layer are glued together to form a single tape having a composite dielectric layer with a metal pattern on both sides. The composite dielectric layer is formed from the two dielectric layers of the individual tapes and the glue there between. FIG. 1 of Angelucci et al. shows a semiconductor chip 18 bonded to the inner ends of flexible conductive fingers 14 of one metal layer. The two metallurgical layers are electrically interconnected as shown in FIG. 4 of Angelucci et al. Conductor 94 on one side of the two-level metal tape is connected through connection apertures 90 and 90′, in the dielectric layers of each tape, to conductor 92 on the opposite side of the composite dielectric layer 80. This approach requires the use of large apertures through the dielectric layers to electrically interconnect a metal conductor on one surface of the composite dielectric to another conductor on the other surface of the composite dielectric.

U.S. Pat. No. 4,538,210 to Schaller shows a circuit board having a window for receiving an electronic device. The device is in the form of a plate having electrical contact locations on both sides and along the edge of the plate. The circuit board has elastic holding tabs of at least two different lengths which project into the window. The tabs form the ends of conductive rows on the circuit board. Upon pushing the plate through the window, the short holding tabs snap back and the plate becomes clamped to the circuit board by the holding tabs. The tabs additionally provide electrical connections between conductor runs of the circuit board and contacts on the plate. There are four variations of this snap coupling shown in FIG. 2 to FIG. 5 of Schaller. In each, the ends of the snap couplings lie in two separate planes in order to provide the clamping feature. The electrical connection between the tabs and plate contacts is by pressure.

An alternative approach is to fabricate a multilevel metal TAB tape using conductive vias or through-holes in the dielectric layers to electrically interconnect a conductor on one metallic layer to an adjacent metal layer. All metal layers are thereby electrically connected to a single metal layer which has beam leads which project inwardly into an aperture in the dielectric layers. The beam leads project inwardly from one metal layer. An IC can be bonded by standard bonding techniques to the inner ends of the beam leads from a single layer. Vias have certain inherent problems. If a via is used to electrically connect a conductor on one layer to a conductor on another layer, there is a statistical variation in the location of the conductors relative to the position of the via. The statistical variation arises from the processes and tools used to fabricate the structures. Because of this variation in alignment, there can be a minimal overlap of the via and conductor which results in a high contact resistance between the conductor and via. To avoid this, either the via or conductor has to be made wider. If the conductor is made wider space is consumed and, therefore, a smaller number of beam leads can be fabricated to project into the aperture for electrical connection to the IC. If the via is made wider, to avoid the via shorting to adjacent beam leads, the spacing between adjacent beam leads has to be increased which also results in fewer beam leads for connection to the IC. In addition, the region of electrical connection of the beam lead to via provides a location where residues of processing can accumulate, resulting in a high contact resistance, an electrical open, or a potential for a reliability failure, all of which result in a reduced manufacturing yield of the multilevel beam lead structure. Reduced yield increases the cost of the fabricated structures.

The multilevel metal structures of the present invention avoid the problems associated with the use of vias. Quite surprisingly, it has been found that beam leads can project inwardly from more than one metallization layer in cantilevered fashion into an aperture and can be formed so that the inner ends of the leads lie in substantially the same plane for bonding to contact locations on an IC. The forming operation can be done simultaneously with bonding of the inner ends to the IC pads as part of an automated process when the multilayered structures are fabricated on a TAB-type tape. The via-free multilayered structure permits electrical connection to state-of-the-art high density VLSI IC devices having a large number of I/O connectors. Also the via-free structures have a higher degree of reliability than structures which use vias.

The multilevel structures of the present invention differ from the structures of Angelucci et al. which describes structures having beam leads projecting into an aperture from one metal layer for electrical connection to an IC and which uses large apertures to electrically connect a second metal layer to the first metal layer.

The multilevel structures of the present invention differ from the structures of Schaller which describes two metal layer structures from which project resilient snap couplings whose ends are not in a single plane, for electrically connecting to and for support of a plate.

Therefore it is an object of this invention to provide improved multilevel IC packaging structures used to electrically interconnect an electronic device to a substrate wherein the structure has more than one metallurgical layer from which beam leads project inwardly toward and in cantilevered fashion over an aperture in the dielectric layers of the structure. The inner ends of the beam leads lie substantially in one plane for bonding to contact locations on the electronic device.

It is another object of this invention to provide an improved TAB tape having a plurality of these multilevel metal structures useful for a low-cost automated process for electrically interconnecting a plurality of electronic devices to a substrate.

Further improvement in the impedance characteristics of a multilayer metal packaging structure can be achieved by varying the dielectric thickness between conductors on adjacent metallization layers.

It is another object of this invention to provide improved multilayered IC packaging structures having variable dielectric thickness to electrically interconnect an electronic device to a substrate.

Further improvement in the impedance characteristics of a multilayered metal packaging structure can be achieved by symmetrically arranging signal lines between power and ground lines.

It is another object of this invention to provide improved multilayered IC packaging structures having improved impedance characteristics by symmetrically arranging signal lines between power and ground lines.

SUMMARY OF THE INVENTION

In its broadest aspect, this invention is improved electronic device packaging structures which have selectively adjusted impedance characteristics and a maximum number of electrical connections for electrical connection to an electronic device.

In a particular aspect of this invention the improved electronic device packaging structures contains at least two metallization layers. A dielectric is disposed between each metallization layer. Each dielectric layer has at least one aperture which is aligned to each other to form a central aperture in the structure through the dielectric layers. At least one beam lead from each of two of the metallization layers projects in cantilevered fashion into the central aperture. The inner ends of the leads lie substantially in the same plane.

In another more particular aspect of this invention, at least one electronic device is bonded to the inner ends of the beam leads.

In another more particular aspect of this invention, at least one beam lead projects outwardly in cantilevered fashion over the outer edges of the dielectric layers. The outer end can be electrically connected to a contact location on a substrate such as a ceramic or printed circuit board. A plurality of beam lead structures of this invention can be fabricated on a flexible tape for automated bonding of an electronic device to the inner ends of the beam leads and for automated bonding of the electronic device and beam lead combination to a substrate.

In another more particular aspect of this invention, a multilayered electronic device packaging structure has at least one of the dielectric layers, between adjacent metallization layers, having variable dielectric thickness.

In another more particular aspect of this invention, a multilayered electronic device packaging structure has signal lines symmetrically disposed between voltage and ground leads on adjacent metallization layers.

These and other objects, features and advantages will be apparent from the following more particular description of the preferred embodiments.

DETAILED DESCRIPTION OF THE PREFERRED EMBODIMENTS

For convenience the inventions described herein will be described in terms of a tape automated bonding (TAB) which is the environment for the preferred embodiments. However, the structures and methods described herein are not limited to the TAB environment.

Figure 1:
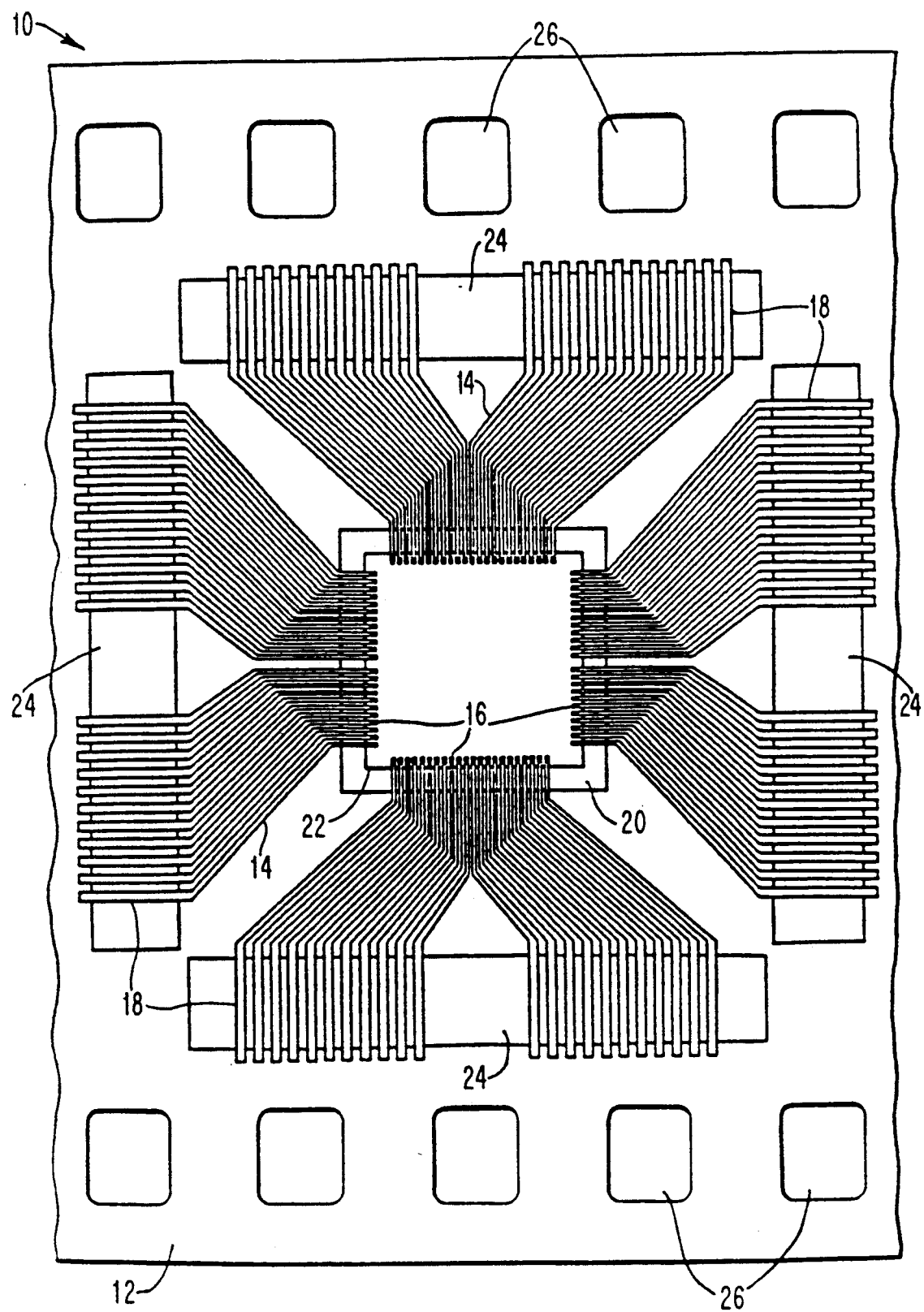
FIG. 1 is a top plan view of a TAB tape having one level of metallization formed into beam leads and one dielectric layer with an electronic device bonded to the inner ends of the beam leads.

Generally in a TAB environment a spaced series of beam lead patterns are fabricated on a flexible supporting structure referred to as a TAB tape which can be wound and unwound from reels for automated processing such as bonding of IC devices to the beam leads and bonding of the IC beam lead assembly to a substrate. However, the invention herein can be used with discrete inflexible supporting structures. FIG. 1 shows an example of one section, 10, of a TAB-type tape having one metal layer and one dielectric layer. The dielectric layer can be a polymeric material having thickness from about ¼ to 10 mils. The tape shown in FIG. 1 has a flexible carrier 12 which can be made from a plastic-type material. A plurality of conductors 14 are fabricated on the carrier 12. Each conductor has an inner lead bond (ILB) end 16 and an outer lead bond (OLB) end 18. The plurality of conductors generally project inwardly towards an aperture in the carrier. FIG. 1 shows the inner ends 16 of conductors 14 projecting inwardly towards aperture 20 and projecting in cantilevered fashion over aperture 20. An integrated circuit device 22 is shown in the vicinity of aperture 20. The inner ends of beam leads 14 are bonded to contact pads, not shown, on device 22. The bonds can be formed by solder bonds and solderless bonds. Solderless bonds can be formed by thermocompression bonding or ultrasonic bonding the beam lead ends 16 to the device pads. The structure in FIG. 1 includes a plurality of apertures 24 in layer 12. The outer ends 18 of beam leads 14 span across the aperture. Apertures 24 permit the outer ends 18 to be bonded to a substrate, such as a printed circuit board, thereby electrically interconnecting device 22 to the substrate. There are a plurality of apertures 26 at the peripheral edges of layer 12. Apertures 26 are for engagement with a sprocket means which advances the TAB tape to provide for automated operations such as inner and outer lead bonding. The active face of the chip and the bonds between the ILB ends and chip pads can be passivated by depositing a polymer material thereon.

Figure 2:
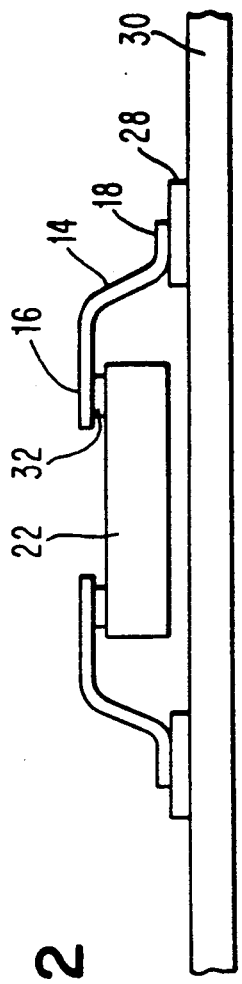
FIG. 2 shows a diagrammatic cross-section of the structure of FIG. 1.

FIG. 2 shows a schematic cross-section of structure 10 of FIG. 1 wherein outer lead ends 18 of beam leads 14 are bonded to pads 28 on substrate 30. Inner lead ends 16 of beam leads 14 are bonded to pads 32 on device 22. Numbers common to FIG. 1 and FIG. 2 represent the same thing.

Figure 3:
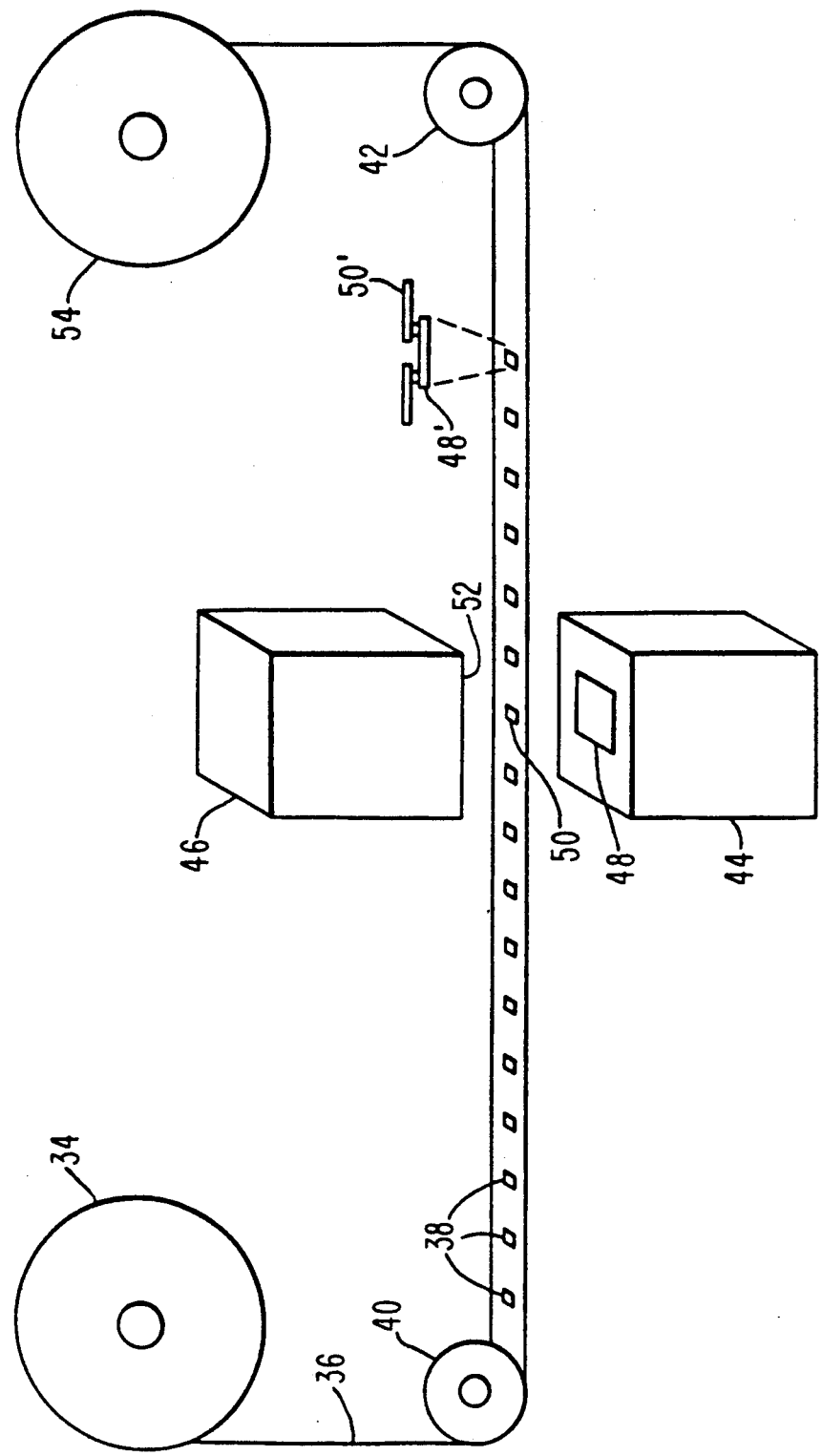
FIG. 3 diagrammatically shows the automated bonding of electronic devices to a TAB tape having a series of beam lead patterns.

FIG. 3 diagrammatically shows a film with a spaced series of sets of beam lead patterns thereon being used in an automated process for electrically connecting an IC device to the inner ends of the beam lead patterns. Wound on reel 34 is a metallized carrier 36 containing a spaced series of sets of beam lead patterns thereon, represented in FIG. 3 by 38. FIG. 1 is an example of one of these patterns. The film is fed by a sprocket feed means represented by 40 and 42. The sprocket feed means has teeth which mesh with the sprocket holes 26 of FIG. 1. The film is fed between fixtures 44 and 46. Fixture 44 has a semiconductor chip 48 held thereon, typically by a commonly used vacuum pick-up which is not shown, with the chip's active face placed facing film 36. The ILB ends of the beam leads of lead set 50 are aligned with the contact pads on the active face of chip 48. Optical systems for aligning contact pads to beam leads, are commonly used in the art. After beam lead set 50 is aligned to chip 48, inner lead bond head 52 heats and presses the inner lead ends against the chip pads to form a thermocompression bond. The bond head is retracted and the vacuum pick-up released. The film is advanced by this sprocket means such as 40 and 42. One assembly of a chip 48' bound to lead frame 50' is schematically shown in FIG. 3. The film with a spaced series of assemblies is then wound up on reel 54.

To take advantage of state-of-the-art VLSI (very large scale integrated) circuit devices which have a high circuit density and high-speed circuits, the number of ILB ends available for bonding to chip contact pads must be maximized and the transmission line properties of the beam leads must be improved.

State-of-the-art IC chips useful to practice the present invention can have as many as 400 I/O, each I/O having a 1 mil dimension with a 2 mil pitch. State-of-the-art beam leads also have an ILB dimension as small as 1 mil with a 2 mil pitch.

In the operation of an IC device, power is supplied to the IC, typically by applying a voltage to predetermined IC I/O pads. A voltage reference is provided by grounding predetermined IC I/O pads, and signals for electrical communication with the IC are provided by the remaining IC I/O pads.

For single metal layer TAB tape the patterning of the single metal layer into a multitude of leads for signal, voltage and ground results in electrical signals closing their current loops by returning over the limited number of leads which supply voltage and ground potentials to the chip. Most of the leads on the single layer TAB tape are signal leads. This geometry results in large self and mutual inductances between signal, power and ground lines which, in order not to exceed the allowable induced noise voltage on signal lines, force the communication speeds of the simultaneously switching circuits to be reduced.

Alternatively, the induced voltage noise can be decreased by introducing a second and, if necessary for high performance applications, a third metal plane into the TAB tape structure.

When a multi-metal layer TAB tape is used for electrical connection to an IC, the beam lead ILB ends, if permitted to project inwardly over apertures in the dielectric layers, would not be in a single plane. The IC contact pads to which the ILB ends are to be electrically connected lie in a single plane.

One structure to provide ILB ends in a single plane for electrical connection to IC contact pads is to electrically connect by means of vias all metal levels, of a multilayered TAB structure, to one of the metal layers on which there are beam leads which project inwardly over an aperture in the dielectric. This provides ILB ends in a single plane.

Figure 4:
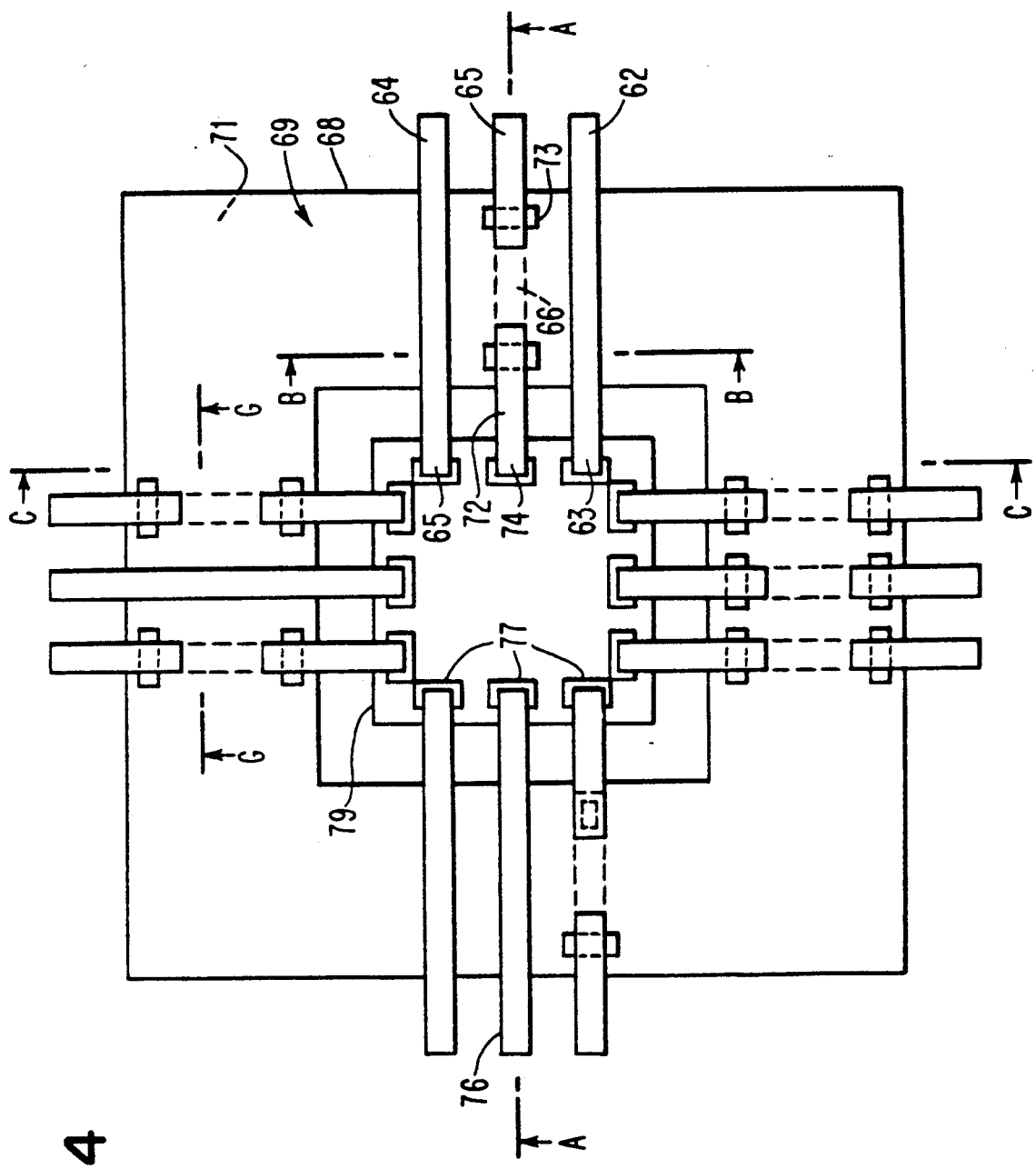
FIG. 4 diagrammatically shows a top plan view of a structure containing an electronic device bonded to the inner ends of beam leads from one metallurgical layer of one lead frame from a TAB-type tape which has two metallurgical layers, one of which is electrically connected to the other layer by vias.

FIG. 4 schematically shows a top view of a two-metal layer TAB tape. Beam leads 62 and 64 are in a first metal layer and have ILB ends 63 and 65, respectively. Beam lead 66 is on a second metal layer. The first and second metal layers are separated by a dielectric film 68. The first metal layer is disposed on surface 69 of dielectric layer 68. The second metal layer is disposed on surface 71 of dielectric layer 68. Beam lead 66 which is below the dielectric layer is shown in phantom. Beam lead 66 is brought up to the first metal layer by conducting via 70. Conducting via 70 is electrically connected to beam lead 72 which has ILB end 74. The ILB ends such as 63, 65 and 74 are electrically connected to pads 77 on IC 79. Beam lead 66 is brought up to the first metal layer by conducting via 73. Conducting via 73 is electrically connected to beam lead 67 which has outer lead bond end 65.

There are a number of disadvantages to using vias to electrically connect beam leads on the first and second metal layers. Generally, the via hole in dielectric layer 68 of FIG. 4 cannot be made with dimensions as small as the beam leads. Beam lead 66 is shown having a width W and via 70 has a width W' which is greater than W. The maximum space achievable between beam leads, such as leads 66 and 64, is determined by the minimum space, d, achievable between beam lead 64 and via 70. Since the minimum via width W' is greater than the minimum beam lead width W, the space on dielectric layer 68 occupied by lead 66 is greater than if no via were required. Therefore, when vias are used the total number of beam leads which can be fabricated in a set of leads on a TAB tape is less than if no vias were used.

Figure 5:
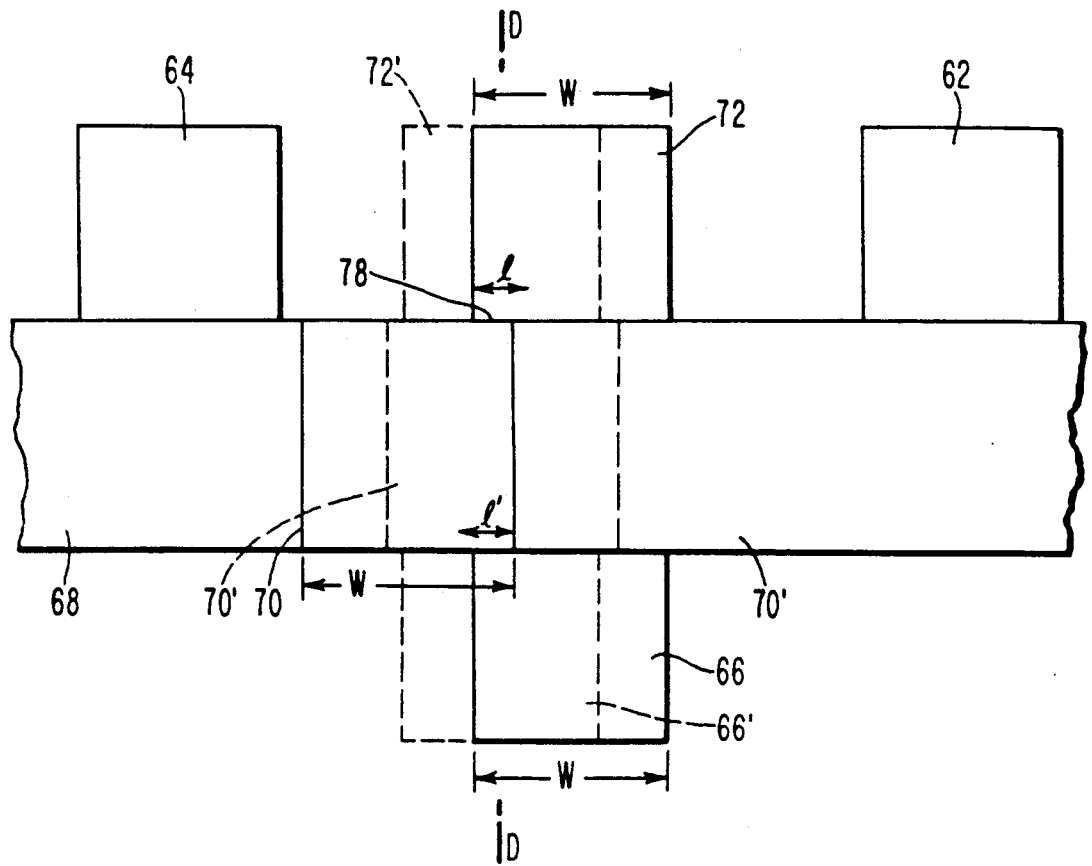
FIG. 5 diagrammatically shows a cross-section of the structure of FIG. 4 along line BB of FIG. 4.

The use of vias has additional potential problems. FIG. 5 shows a cross-section along the line BB of FIG. 4. Numbers common to FIG. 4 and FIG. 5 represent the same thing. Beam leads 62, 64 and 72 are disposed on surface 69 of dielectric layer 68. Beam lead 66 disposed on surface 71 of dielectric layer 68 is electrically connected to beam lead 72 through conducting via 70 in dielectric layer 68. Line DD of FIG. 5 represents the center line for leads 72 and 66 and for via 70. The center line represents the line about which the leads and via are designed. In any manufacturing operation there is statistical variation in the fabrication of features about the center line. The design location of leads and via are shown in phantom: 72', 70' and 66' for features 72, 70 and 66, respectively. Leads 72 and 66 are shown offset to the right of the center line. Via 70 is shown offset to the left of the center line. Lead 72 intersects via 70 in region 78 of width 1 and lead 66 intersects via 70 in region 80 of width 1'. Both intersection regions 78 and 80 are of substantially smaller dimensions than the width W of leads 72, 66 and width W' of via 70. A high contact resistance will occur in regions 78 and 80. The contact resistance varies inversely with dimension 1 and 1'. In order to avoid a high contact resistance, generally, the via or lead width must be increased so that the intersection dimension of region 78 and 80 is sufficiently large to avoid small areas in these intersecting regions. Increasing the via or lead width will increase the space occupied by the lead and thus result in a smaller total number of beam leads for a given beam lead set.

In addition to the geometrical limitations of via 70, a good electrical connection between via 70 and leads 66 and 72 must be made. As part of a manufacturing process using vias, to achieve good electrical contact between a via and a lead, the contact interface must be cleaned off to avoid leaving residues from processing steps which can result in higher than necessary contact resistance, electrical opens and reliability failures at these joints. In addition, the conducting via itself provides an additional feature contributing to manufacturing yield loss and reliability failures.

Figure 6:
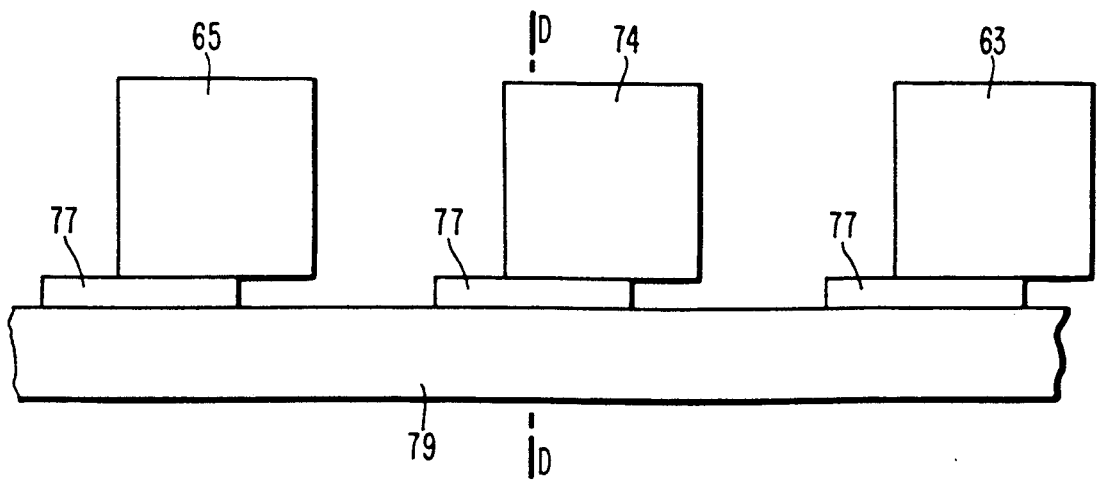
FIG. 6 diagrammatically shows a cross-section of the structure of FIG. 4 along the line CC of FIG. 4.

FIG. 6 is a cross-section along line CC of FIG. 4. Beam lead ends 63, 74 and 65 are shown electrically connected to pads 77 on IC 79.

Figure 7:
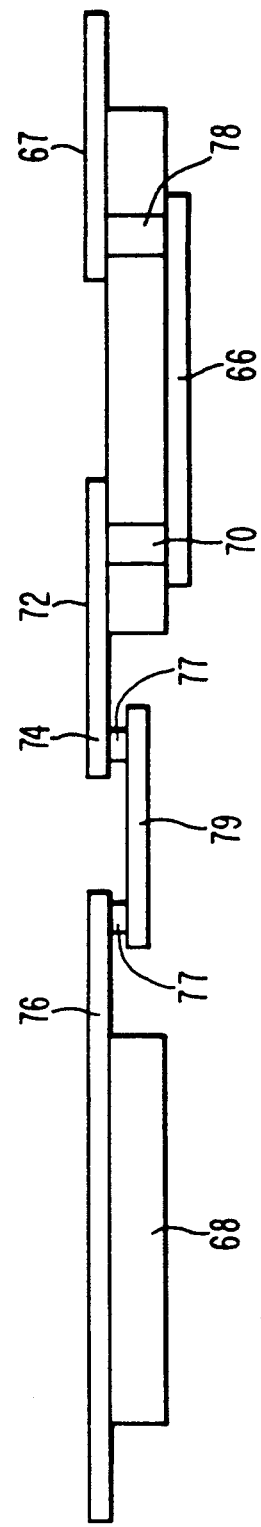
FIG. 7 diagrammatically shows a cross-section of the structure of FIG. 4 along the line AA of FIG. 4.

FIG. 7 is a cross-section along line AA of FIG. 4. All numbers common between FIG. 7 and FIG. 4 represent the same thing.

Figure 8:
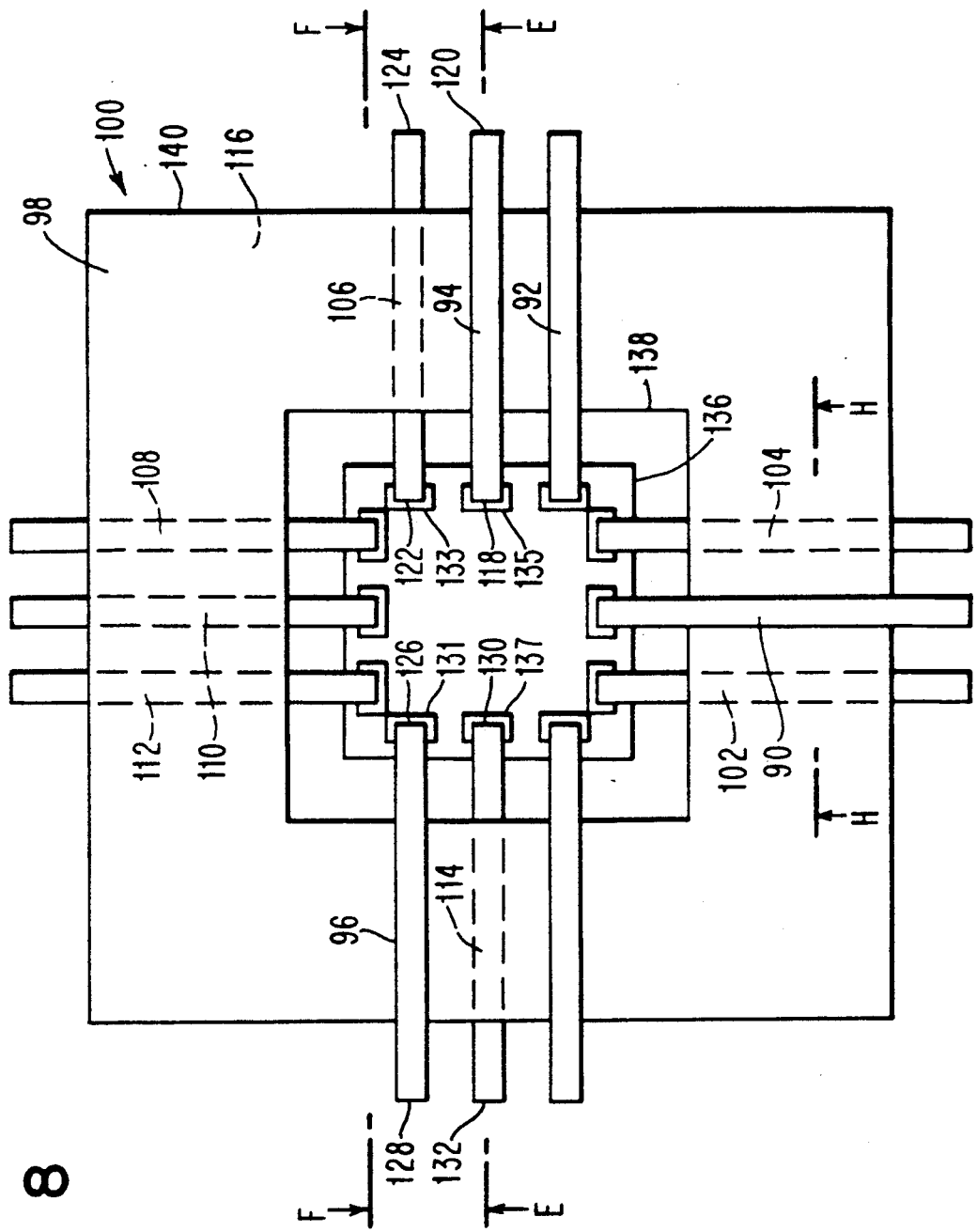
FIG. 8 diagrammatically shows a top plan view of a structure containing an electronic device bonded to the inner ends of beam leads from each metallurgical layer of one lead frame from a TAB-type tape which has two metallurgical layers.

FIG. 8 shows a diagrammatic top plan view of TAB tape structure according to the present invention. This structure has two metal levels and does not use vias. Two metal levels are exemplary only. More than two metal levels can be used to practice the present invention. Beam leads 90, 92, 94 and 96 form the first metal layer on surface 98 of dielectric film 100. Beam leads 102, 104, 106, 108, 110, 112 and 114 form the second metal layer on surface 116 of dielectric layer 100. Surface 116 is not visible in the top plan view of FIG. 8. Surface 116 is opposite to surface 98 which is visible. Those parts of the beam leads on the second metal layer which are not visible in the top plan view of FIG. 8 are shown in phantom. Each beam lead has an inner lead end and an outer lead end. Beam lead 94 has an inner lead end 118 and an outer lead end 120. Beam lead 106 has an inner lead end 122 and an outer lead end 124. Beam lead 96 has inner lead end 126 and outer lead end 128. Beam lead 114 has inner lead end 130 and outer lead end 132. The inner lead ends are bonded to contact pads, such as 131, 133, 135 and 137 on IC 136. The beam lead ILB ends project in cantilevered fashion over aperture 138 in dielectric layer 100. The OLB ends of the beam leads project in cantilevered fashion over the outer edge 140 of dielectric layer 100.

Figure 9:
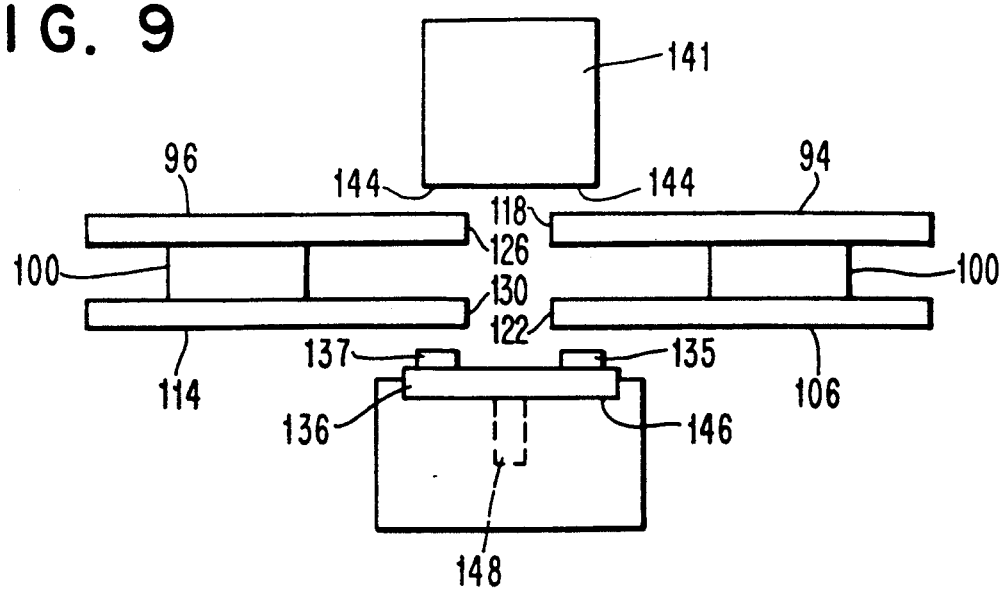
FIG. 9 diagrammatically shows the structure of FIG. 8 contained between lines EE and FF prior to bonding the inner ends of beam leads to the electronic device. The bonding tool which is not shown in FIG. 8 is shown in FIG. 9 diagrammatically in cross-section which is indicated by shading.

FIG. 9 diagrammatically shows the process of bonding ILB ends of beam leads on two different metal layers of FIG. 8. FIG. 9 shows that part of the structure of FIG. 8 between lines EE and FF. Those parts of FIG. 9 shows diagrammatically bond head 141 and fixture 142, which are not shown in FIG. 8. Numbers which are common between FIG. 8 and FIG. 9 represent the same thing. The bonding operation diagrammatically represented in FIG. 9 is a thermocompression bonding operation which is commonly known in the art. IC 136 is held in place in well 146 in fixture 142 typically by a vacuum pick-up diagrammatically shown by 148. The beam lead ILB ends are aligned by commonly used optical systems to corresponding IC contact pads. In FIG. 9, ILB end 130 of lead 114 is aligned over pad 137, ILB end 118 of lead 94 is aligned over pad 135. ILB end 126 of lead 96 and ILB end 122 of lead 106 are aligned over pads, which are not shown in FIG. 9 since the pads are behind pad 137 and 135, respectively. Bond head 141 has a means for heating the head such as, for example, a heating coil, cartridge heater, or resistive heating by flowing electric current through the bond head.

Bond head 141 is heated to a predetermined temperature, and the head is moved towards IC 136. Bond head tip 144 engages with the ILB ends of the beam leads and presses them against the IC contact pads with sufficient heat and pressure to form a thermocompression bond.

Quite surprisingly, it has been found that beam leads, projecting inwardly in cantilevered fashion over apertures in dielectric layers from different metallization layers, can be bonded to IC pads by pressing with a bond lead without having the cantilevered part of the beam lead distort so as to take the ILB ends of the beam leads out of alignment with their respective IC contact pads. This technique permits the fabrication of structures without the use of vias, thereby avoiding the additional process complexity of vias and the inherent problems described above.

The beam leads can be formed from electrically conducting meterials such as Cu, Al and Au. The ILB ends are preferably coated with a conducting material such as Au, Cu, Ni or Sn, which will solderlessly bond to the IC contact pads such as, for example, by thermocompression bonding or ultrasonic bonding. Contact pad structures useful to form solderless bonds to beam leads are described in co-pending U.S. patent application Ser. No. 06/895,092, filed Aug. 11, 1986, entitled, "Aluminum Bump, Reworkable Bump and Titanium-Nitride Structures for TAB Bonding," to Bickford et al. which is incorporated herein by reference. The top layer of these structures have solderlessly bondable layer such as, for example, Cu, Al, Au, Ag or alloys thereof.

To form an effective low contact resistance solderless thermocompression bond, the ILB ends are heated to a temperature of from about 350 C. to about 450 C.

The bond of the beam lead ILB end to the IC contact pads can also be a solder bond. To form a solder bond the IC contact pads can be coated with a top surface of solder such as, for example, Pb/Sn, Pb/In, Pb/Sb, or other solder. The beam lead ILB ends and IC contact pads are coated with a solder wettable material such as, for example, Au, Cu and Ni. The beam leads are pressed against the IC contact pads as described above, and the solder is heated to a temperature sufficient to melt the solder. The solder is cooled and the bond is formed. The melting temperature of 95/5 Pb/Sn solder is about 312 C. and for 37/63 Pb/Sn solder is about 183 C. These solder bonding operations are commonly known in the art.

Figure 10:
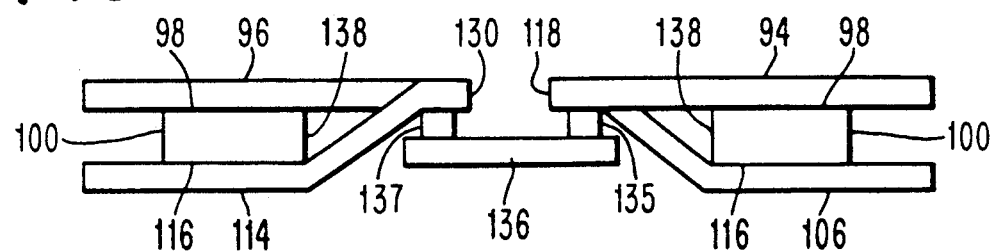
FIG. 10 to FIG. 12 diagrammatically show the result of the bonding operation of FIG. 9.
Figure 11:
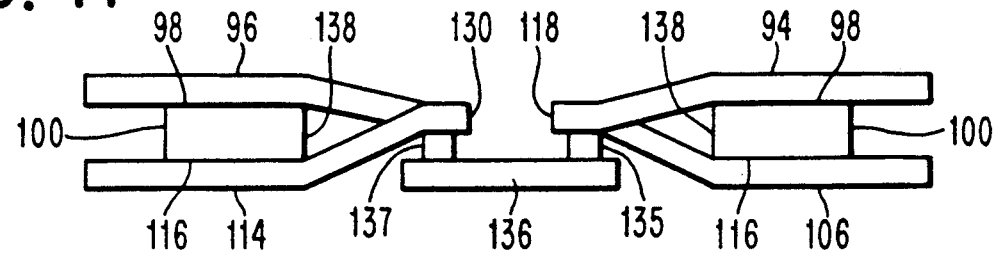
Figure 12:
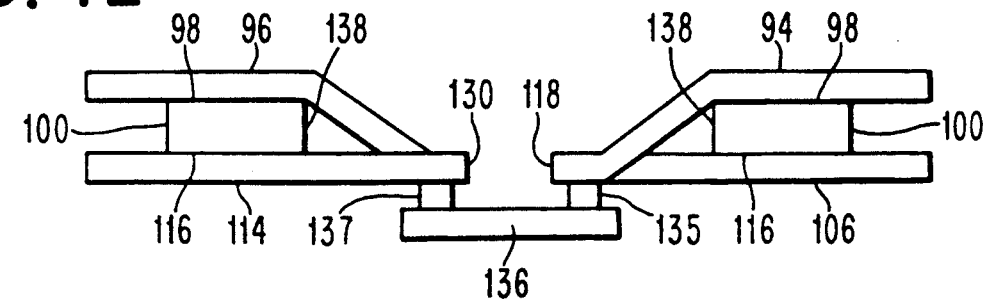

The structures resulting from the thermocompression bonding diagrammatically shown in FIG. 9 are shown in FIG. 10 to FIG. 12. All numbers common between FIGS. 9, 10, 11 and 12 represent the same thing. FIGS. 10, 11 and 12 differ only in the degree of bending of leads on surface 98 of dielectric layer 100, and of the leads on surface 116 of dielectric layer 100. The difference in bending occurs if the dielectric layer is flexible, as described with reference to FIGS. 1, 2 and 3, and if the flexible film having the beam leads thereon is fed to the bonding operation shown in FIG. 9 in the manner described with reference to FIG. 3. As the leads are pressed the flexible dielectric layer will flex. If the number of leads projecting in cantilevered fashion over aperture 138 in dielectric 100 from surface 98 is greater than from surface 116, a structure of the type shown in FIG. 10 will result. If the number of leads projecting over the aperture are about the same from surface 98 and surface 116, a structure of the type shown in FIG. 11 will result. If the number of leads projecting over the aperture is greater from surface 116 than from surface 98, then a structure of the type shown in FIG. 12 results. The inner ends of the beam leads lie substantially in the same plane which is defined by the contact pad surfaces to which the beam leads are bonded. Because of variations in pad height or bending of the electronic device, the contact pad surfaces may not be in an exact geometrical plane. The term "substantially in the same plane" takes into account such variations.

The structure shown in FIG. 10 to FIG. 12 can be fabricated without bonding the IC to the ILB ends. An unheated bond head can press the inner ends of the leads against a suitable surface to form the leads so that the ILB ends substantially lie in the same plane. In the preferred embodiment, however, it is more convenient and less costly to simultaneously form the leads and bond the ILB ends to IC contact pads.

Figure 13:
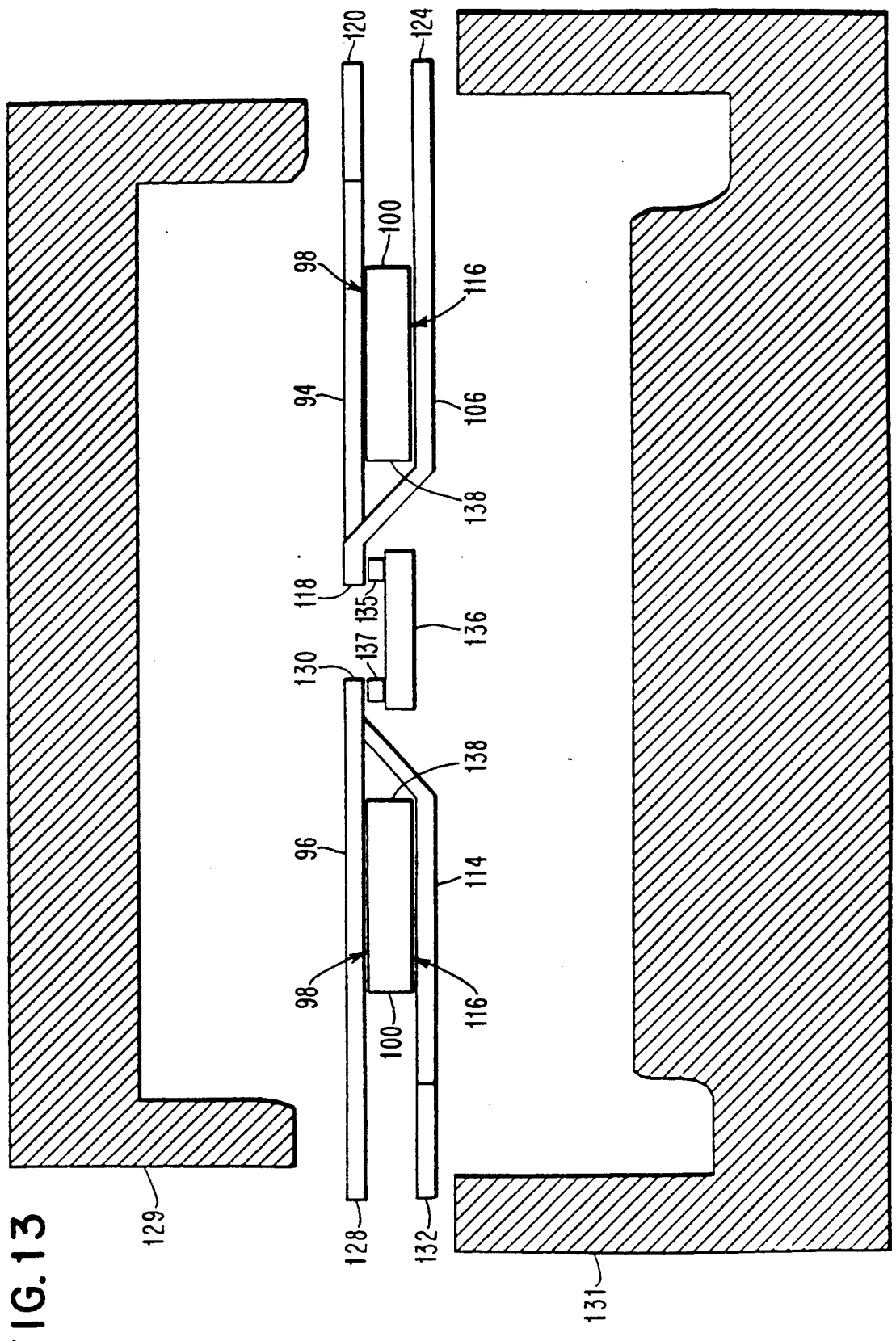
FIG. 13 diagrammatically shows the structure of FIG. 12 aligned with a forming and excising tool.
Figure 14:
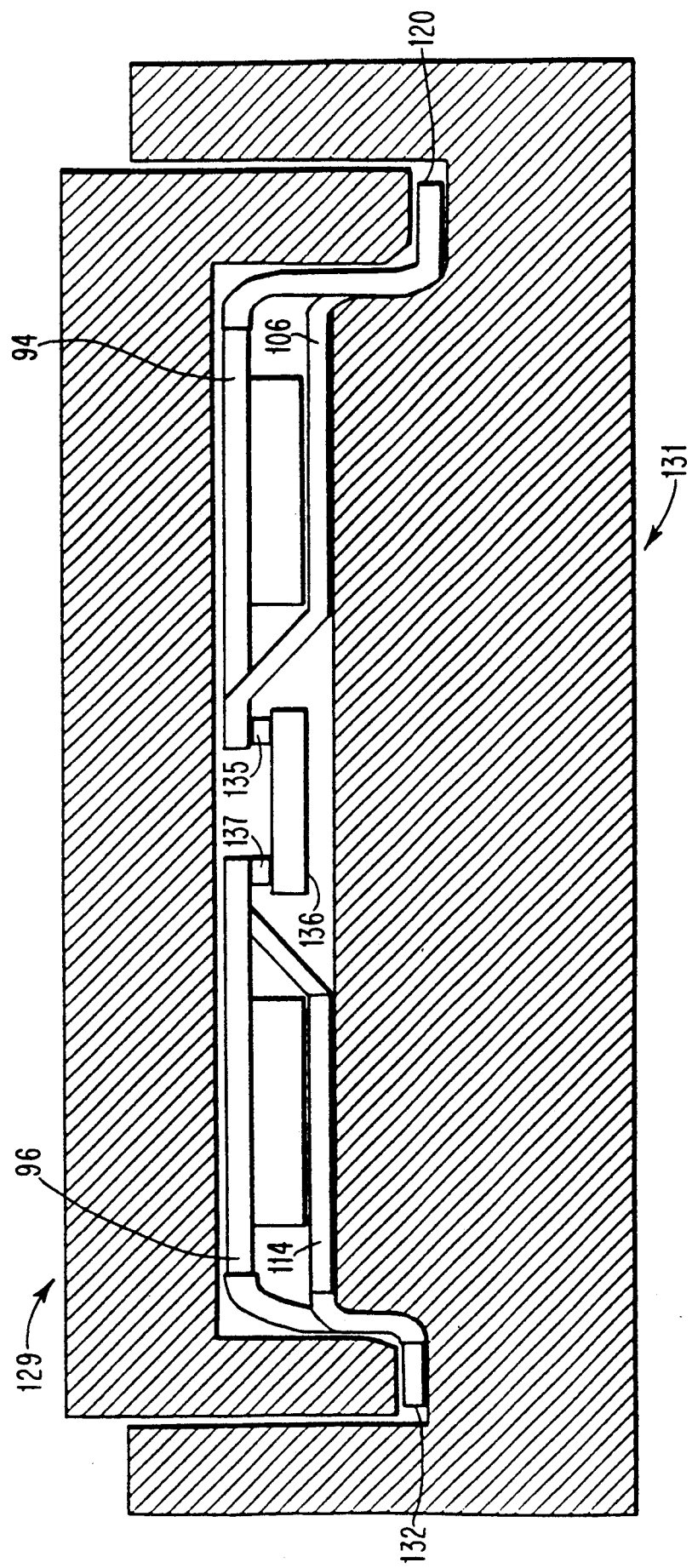
FIG. 14 diagrammatically shows excising and forming of the outer ends of leads of the structure of FIG. 12.

Prior to bonding of the outer leads of the TAB package to a substrate the leads must be excised and formed. In order to accomplish this the assembly of an IC bonded to the ILB ends of a set of leads can be automatically fed into a commonly used excise and form tool. This automatic feeding is similar to the automatic feeding for ILB bonding shown and described with reference to FIG. 3. FIG. 13 and 14 diagrammatically show the excise and forming operation. Excise punch 129 moves down cutting the outer edges of the leads 120, 124, 128 and 132 and presses them down into the die cavity 131 forming the leads. Surprisingly it is found that this process provides leads that are substantially coplanar and ready for conventional outer lead bonding. Also quite surprisingly the punch and die set used for excising and forming the OLB is not different from the tooling used for excising and forming single metal-level TAB tape. Numbers common between FIG. 10, FIG. 13 and FIG. 14 represent the same thing.

Figure 15:
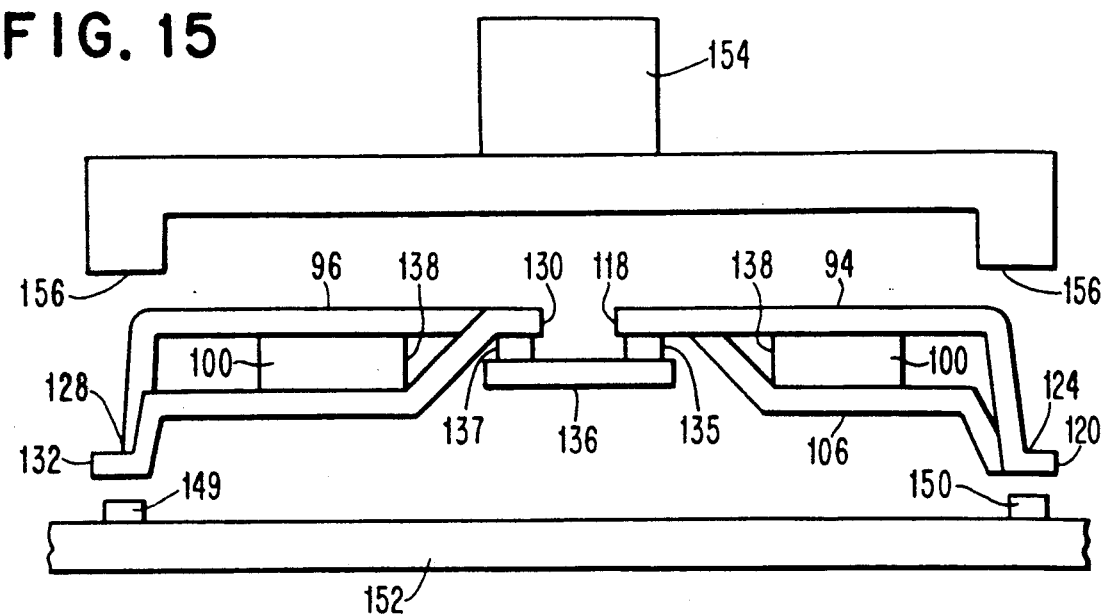
FIG. 15 diagramatically shows bonding of the outer lead ends of the formed leads of FIG. 14 to a substrate.

FIG. 15 diagrammatically shows bonding of the structure shown in FIG. 14 to a substrate 152 which can be a ceramic material, a glass ceramic material, a polymer, and the like. Numbers which are common between FIGS. 14 and 15 represent the same thing. The substrate 152 and contact pads 149 and 150 thereon are shown in cross-section. Beam leads 94 and 114 are shown in cross-section. IC 136 and the IC pads 135 and 137 are shown in cross-section. Beam leads 96 and 106 are not in the plan of the figure and are therefore not shown in cross-section. Outer lead bond (OLB) end 120 of beam lead 94 is aligned with substrate pad 150. OLB end 124 is aligned with a substrate pad behind substrate pad 150 which is not visible in the FIG. 15. OLB end 132 is aligned with substrate contact pad 149. OLB end 128 is aligned with a substrate pad behind substrate pad 148 which is not visible in the FIG. 15. The alignment can be achieved using commonly available optical alignment systems. Substrate 152 is held in a commonly used fixture which is not shown. Bond head tip 156 contacts OLB ends 120, 124, 128 and 132 and presses the OLB ends against the corresponding substrate contact pads to which they are aligned. The bond head can be heated in a similar manner to the inner lead bond head shown and described with reference to FIG. 9. Solderless or solder bonds can be formed between the OLB ends and the substrate contact pads. Similar beam lead and contact pad metallurgy and bonding temperatures and conditions apply to OLB bonding as to the ILB bonding operation shown and described with reference to FIG. 9.

Figure 16:
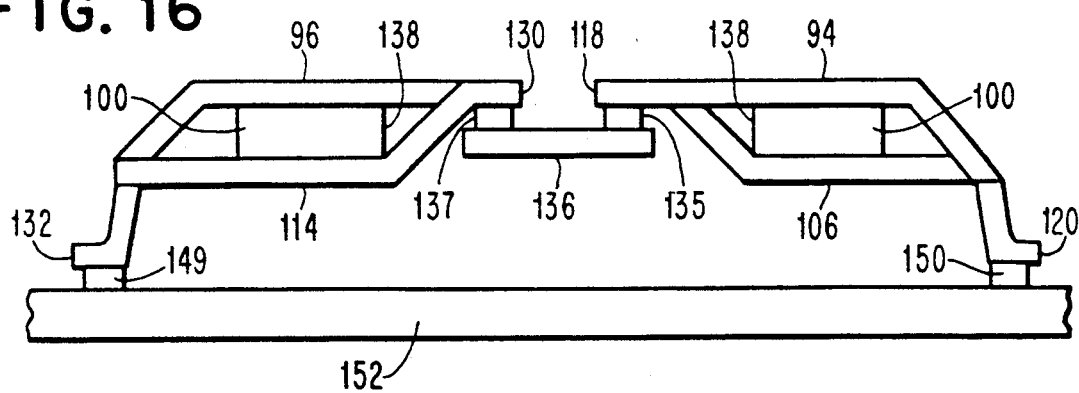
FIG. 16 diagrammatically shows the result of the bonding operation of FIG. 15.
Figure 17:
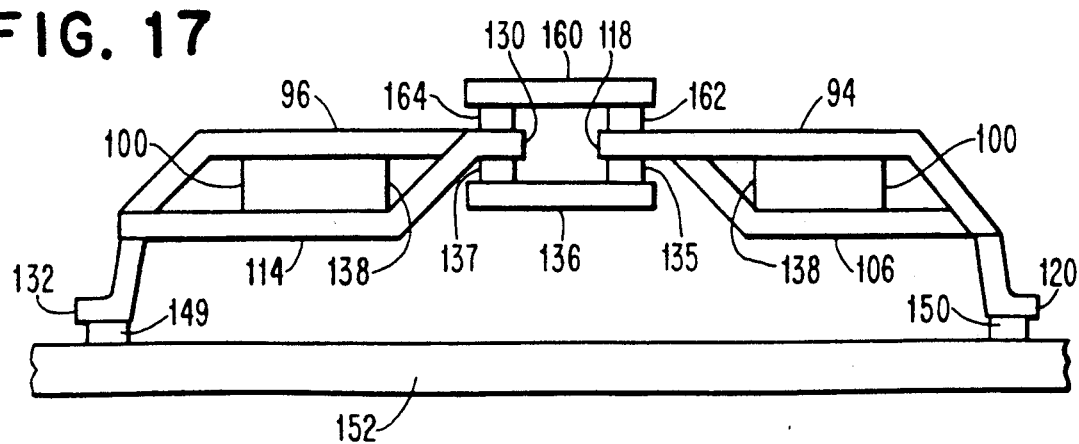
FIG. 17 diagrammatically shows a structure, similar to the structure of FIG. 16, having two electronic devices bonded to the inner ends of beam leads.

FIG. 16 shows the result of the bonding operation diagrammatically shown in FIG. 15. FIG. 16 shows one chip bonded to a beam lead set shown in top plan view in FIG. 8. One assembly of a chip mounted to the beam leads is shown mounted to the substrate 152. A plurality of these assemblies can be mounted to one substrate. The substrate 152 can contain electrical conductors which can electrically interconnect the assemblies such as on a printed circuit board or ceramic substrate in an electronic computer system. More than one IC can be bonded to the ILB ends of a beam lead set as shown in FIG. 17. All numbers common between FIGS. 16 and 17 represent the same thing. FIG. 17 has, in addition to the elements of FIG. 16, IC 160 which has contact pads 164 and 162 which are not shown in cross-section. Pad 162 can be electrically connected to ILB end 122 (shown in FIG. 9) of beam lead 106. Pad 164 can be electrically connected to ILB end 126 (shown in FIG. 9) of beam lead 96. Details about the structure and method of fabrication of double electronic device structures are found in U.S. Pat. No. 4,862,322, filed May 2, 1988, and entitled, "Double Electronic Device Structure Having Beam Leads Solderlessly Bonded Between Contact Locations On Each Device And Projecting Outwardly From Therebetween," to H. R. Bickford et al. which is incorporated herein by reference. Additional details about inner and outer lead bonding, contact pad and beam lead metallurgy can be found in the Bickford et al. application.

Figure 18:
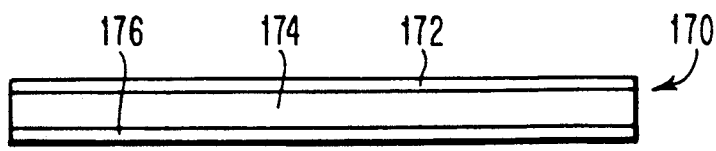
FIG. 18 to FIG. 28 schematically show a process to fabricate a TAB-type tape having two metallurgical layers, both of which are fabricated together.
Figure 19:
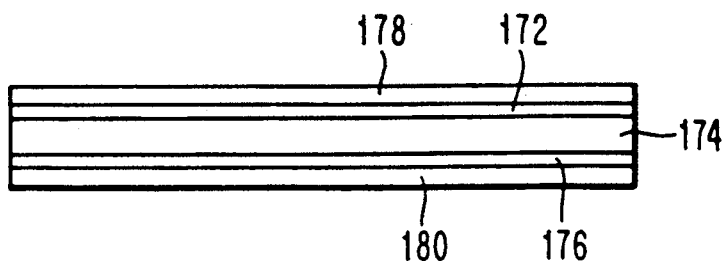
Figure 20:
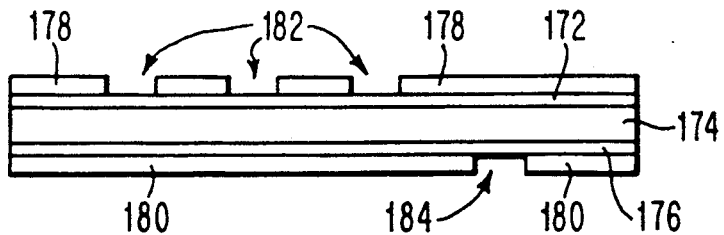
Figure 21:
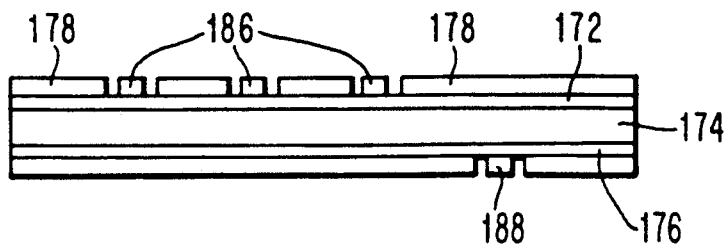
Figure 22:
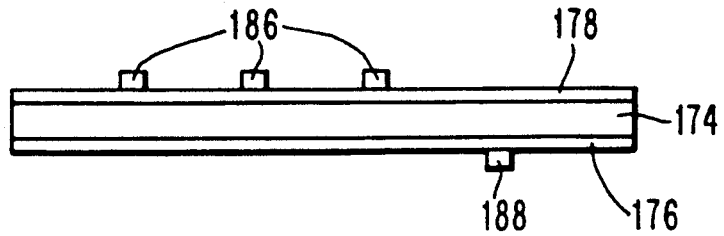
Figure 23:
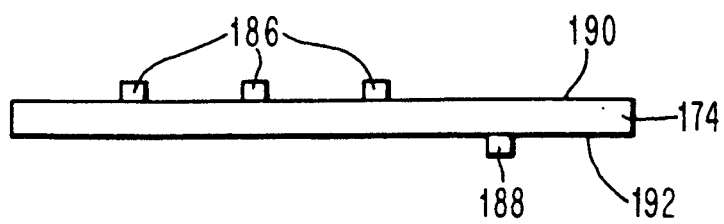
Figure 24:
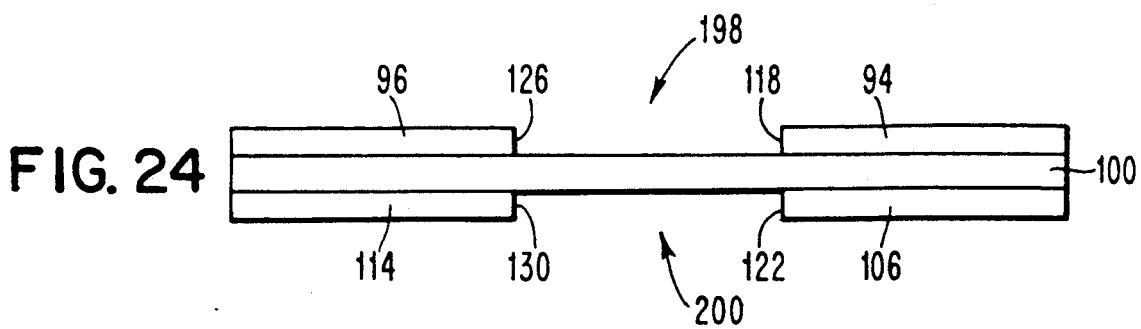
Figure 25:
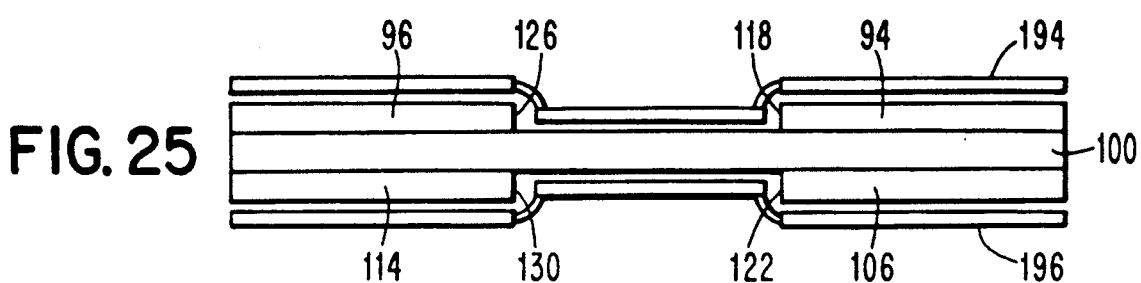
Figure 26:
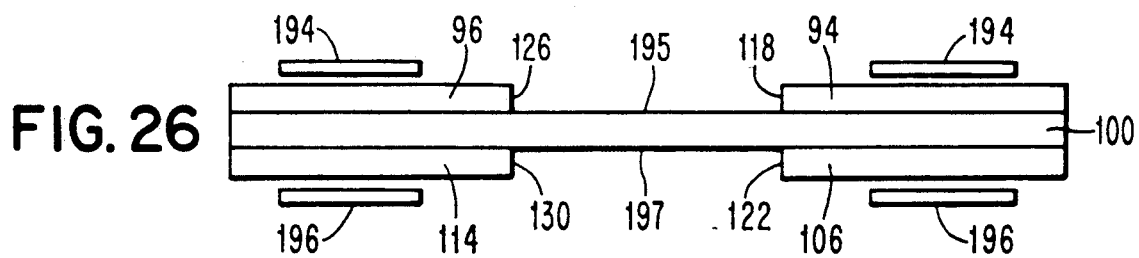
Figure 27:
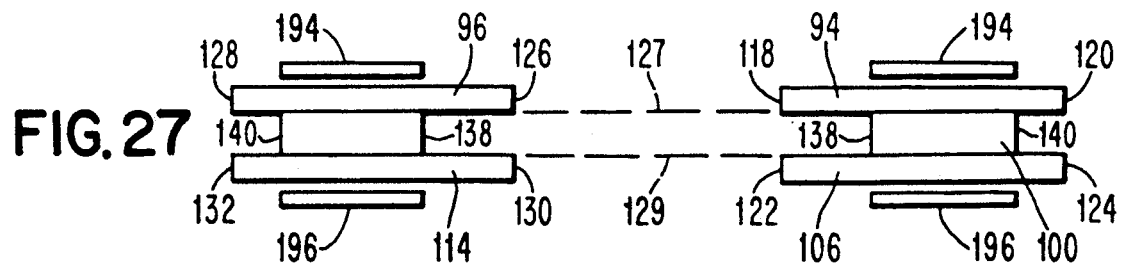
Figure 28:
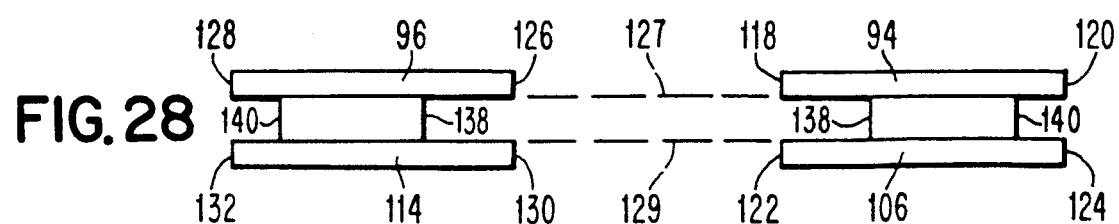

FIGS. 18 to 28 diagrammatically show a process sequence for fabricating two metal layers on a flexible dielectric film such as a polyimide film. FIG. 18 to 23. show the fabrication of the type of structure in FIG. 8 in cross-section along line II of FIG. 8. The lead arrangement of FIG. 8 is not the same as the lead arrangement of the structure fabricated in FIG. 18 to 23. In FIG. 18 starting structure 170, a metal/dielectric/metal film composed of metal layer 172 dielectric layer 174 and metal layer 176. In the preferred embodiment 170 has a polyimide dielectric layer. The metal layers are formed by first sputtered coating with Cr and then Cu on each side of the polyimide. The Cr is used to promote adhesion and the thin Cu provides a base for later electroplating of Cu to form the leads. Such material is commercially available from a number of sources including Southwall Inc. The use of a Cr/Cu plating base is exemplary only and not limiting. FIG. 19 diagrammatically shows resist type layer 178 and 180 such a dry film photoresist available from Dupont under the name RISTON applied to metal layers 172 and 176. After application of the resist both sides of resist covered structure of FIG. 19, are simultaneously exposed through photomasks using standard exposures as recommended by the photoresist manufacturer. FIG. 20 shows the part after the resist has been developed according the resist manufacturer's instructions. The process leaves openings 182 in the resist layer 178 and opening 184 in resist layer 180 wherever leads are desired. At this stage leads are patterned onto the exposed layer 172 through openings 182 in resist layer 178 by standard pattern plating techniques such as, for example, using an acid Cu plating solution. FIG. 21 shows the structure of FIG. 20 after pattern plating. Leads 186 are shown on metal layer 172 and lead 188 on metal layer 176. FIG. 22 shows the structure of FIG. 21 after the resist has been removed using standard processes. At this point the thin plating base 172 and 176 is removed by a quick etch in a standard etch bath leaving the structure shown in FIG. 23. At this point the Cu pattern of leads is completed. FIG. 23 shows leads 186 on surface 190 of dielectric layer 174 and beam lead 188 on surface 192 of dielectric 174. FIG. 24 shows the same structure as FIG. 23 but from a different perspective. FIG. 24 to FIG. 28 show the fabrication of the type of structure in FIG. 8 between lines EE and FF of FIG. 8. Those parts of FIG. 24 to FIG. 28 which are shown in cross-hatch are along the cross-section lines EE. Numbers common between FIG. 8 and FIG. 24 to FIG. 28 represent the same thing. The next step in the process is to open windows in the dielectric 100. FIG. 25 shows the structure of FIG. 24 after the application of resist type material 194 to top surface 198 of the structure of FIG. 24 and resist 196 to the bottom surface 200. Again, a conventional dry film resist such as Dupont's RISTON can be used. As shown in FIG. 26 resist layers 194 and 196 are patterned by exposing the resist on both sides simultaneously through a mask to open regions 195 and 197 in resist layers 194 and 196 respectively. FIG. 26 shows the part after the resist has been developed according to the resist manufacturer's specification. The resist protects the dielectric 100 in all areas except where it is to be removed. FIG. 27 shows the structure of FIG. 26 after the dielectric has been removed by etching. In the preferred embodiment the polyimide dielectric is removed by etching in a hot KOH solution. This step leaves apertures with edges 138 and 140 in the dielectric for bonding of the inner lead and outer lead ends, respectively. FIG. 28 shows the completed structure after removal of the photoresist. Dashed lines 127 and 129 are the edges of the dielectric in the background.

FIGS. 18 to 28 show a process sequence for fabricating a TAB-type tape having two metal layers. It will be apparent to those of skill in the art that more than two metal layers having a dielectric layer between each metal layer can be fabricated by extending the process sequence described.

A multi-level metal structure has a plurality of dielectric layers. Each dielectric layer has an aperture into which the inner ends of beam leads can project in cantilevered fashion over the aperture edge. The apertures of each dielectric layer are aligned so as to form a central aperture in the dielectric layers of the multi-layered structure. It is not necessary that the apertures of each dielectric layer have the same dimensions. The overall dimensions of the central aperture are large enough to permit bonding of the ILB ends, projecting into the central aperture, to IC contact pads.

In a multi-level metal structure one metallization layer can be used for signal lines. This layer would have a large number of beam leads projecting inwardly over the aperture in the dielectric layer. Another metallization layer could provide a ground plane which is made up of one or more large conductor areas. One or more other metallization layers can provide one or more voltage planes. A voltage plane can be made up of one or more large conductor areas. More than one voltage can be provided from a single metallization layer. The voltage and ground planes can be placed relative to the signal layer to provide the desired flux shielding and impedance characteristics.

The structures, and processes for fabrication thereof, described herein provide TAB tape structures which avoid the use of vias and the problems associated therewith to electrically connect all metal layers to one layer from which beam leads project inwardly in cantilevered fashion over an aperture in the dielectric layer of the TAB structure to provide beam lead ends for electrical connection to contact pads on an IC. According to the present invention beam leads from a plurality of metal layers project inwardly in cantilevered fashion over apertures within dielectric layers. Quite surprisingly, it has been found that using standard bonding tools, the beam lead ends can be bonded to IC contact pads with high yield and reliability. These structures being fabricated by a substantially simpler process than a via process thereby are less costly to fabricate. Avoiding vias also results in denser inner lead bond end patterns, thereby permitting electrical connection to denser ICs.

While the invention has been illustrated and described with respect to preferred embodiments, it is to be understood that the invention is not limited to the precise constructions herein disclosed, and the right is reserved to all changes and modifications coming within the scope of the invention as defined in the appended claims.

In prior art multimetal level TAB tapes the dielectric between adjacent metallization levels has a uniform thickness.

Figure 29:
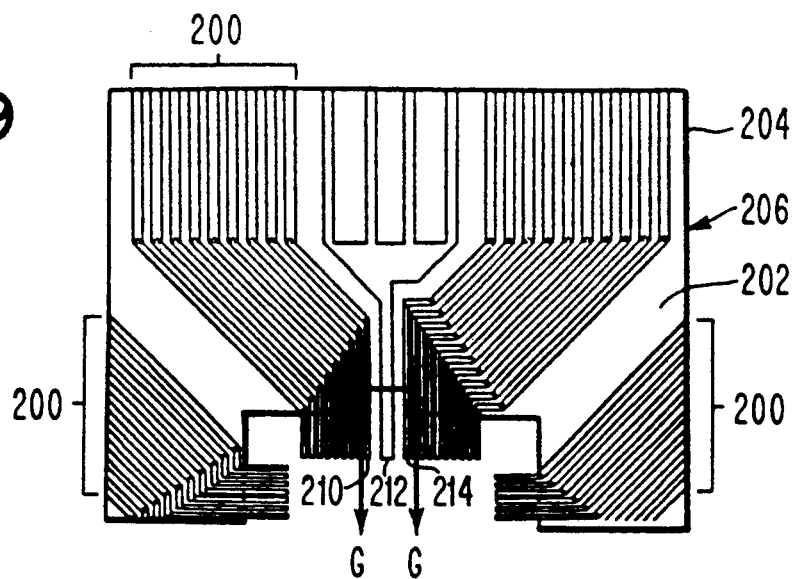
FIG. 29 shows a section of TAB tape having two levels of metallization.

FIG. 29 shows top plan view of a section of TAB type tape having a plurality of beam leads 200 on surface 202 of dielectric layer 204. On the opposite surface 206 of dielectric layer 204 there is a second metallization layer 208 which is not visible in the view of FIG. 29.

Figure 30:
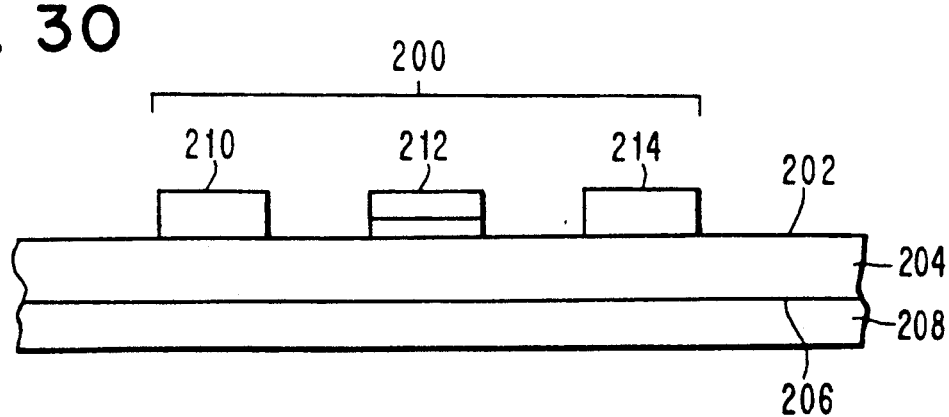
FIG. 30 is a cross section along line GG of FIG. 29.

FIG. 30 is a cross section along the line GG of FIG. 29 of a typical prior art double metal layer TAB tape. Numbers common between FIG. 29 and FIG. 30 represent the same thing. Metallization layer 208 is shown as a continuous metal layer. This is exemplary only and not limiting. A continuous metal layer 208 can form a ground or a voltage plane.

The characteristic impedance between conductors 210, 212, 214 and plane 208 depends on the height, h, and the width, w, of the conductors and the thickness, d, of the dielectric layer 204. In prior art structures the conductors 210, 212 and 214 are fabricated from a single metal layer which is uniformly deposited over surface 202 of dielectric layer 204. The metal layer is patterned by standard photolithographic processes. The characteristic impedance of the conductors 210, 212 and 214 can be varied only by varying the dimension W. The dimension h and d are fixed by the constraints of the processing. Therefore, the characteristic impedance of the conductor cannot be varied other than by varying w, the width. Because of process limitations there is a minimum width for a line. In the situation where it is desired to decrease the characteristic impedance, e.g., in a power distribution line, either W has to be increased or h has to be decreased.

When the TAB type tape shown in FIG. 29 is being electrically connected to a VLSI electronic device the maximum number of beam leads 200 are required for electrical connection to the large number of I/O on the electronic device. Therefore, increasing the width W of a particular beam lead is not the most desirable way to selectively adjust the selected beam lead characteristic impedance relative to the characteristic impedance of another beam lead. The characteristic impedance of a beam lead is adjusted to match the impedance of the electronic device I/O to which the beam lead is electrically connected to minimize signal reflections at the point of electrical connection. Moreover, it is desirable, to have a very low impedance for a beam lead electrically connecting the power distribution system to an electronic device I/O.

Figure 31:
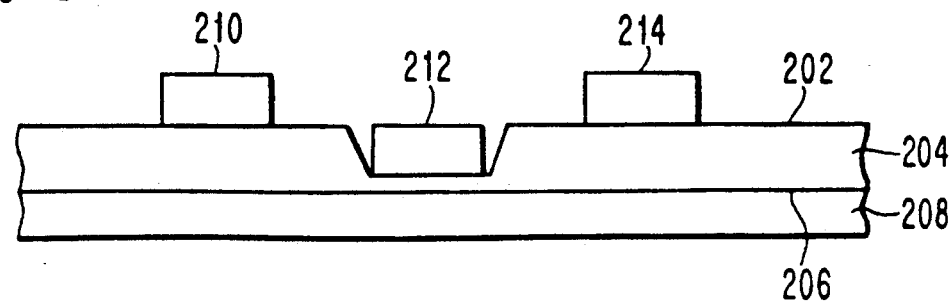
FIG. 31 diagramatically shows a cross section similar to FIG. 30 wherein the dielectric layer between metallization layers has variable thickness.

For the case of a two metal layer TAB tape as shown in FIG. 29 and 30, if conductor 212, for example, is assumed to be a power input conductor it is desirable that it have a low impedance so that the beam lead at the point of electrical connection to the electronic device I/O looks, to the maximum extent possible, like an ideal voltage source. FIG. 31 shows a structure according to the present invention. Numbers common between FIG. 29 and FIG. 31 represent the same thing. As assumed above conductor 212 represents a TAB beam lead which supplies power to an electronic device. The dielectric thickness between beam lead 212 and metallurgical layer 208 is d'.

In the structure shown in FIG. 31 having two metallurgical layers, one metallurgical layer is on surface 206 of dielectric layer 204 and the other metallurgical layer is on surface 202 of dielectric layer 204. In a two metal layer TAB type tape, one metallurgical layer is typically a ground plane which is represented by 208 on FIG. 28. The second metal layer would contain signal lines and power leads. In FIG. 31, 212 represents a power lead and 210 and 214 represent signal leads. Signal leads are typically fabricated to have from between about 50 to about 80 ohms characteristic impedance to match the input of the electronic device I/O to which they are electrically connected.

Several methods for fabricating a variable thickness dialectric TAB tape having the generic structure shown in FIG. 31 are described below. These methods are exemplary only and not limiting.

FIG. 32 to FIG. 40 shows one method of fabricating a variable thickness dielectric TAB tape. By commonly known methods, e.g., spraying, dipping, lamination, a dielectric layer 220 is formed on a thicker dielectric layer 222. Layer 220 can be, for example, a polyimide or other high temperature etchable organic material, e.g., polyetherimide, epoxies, siloxanes. The thickness of layer 220 and 222 depends on the dielectric constant of the materials used to fabricate these layers and on the characteristic impedance desired for the fabricated beam leads. If layer 222 is a polyimide of thickness of from about 50 microns to about 100 microns and if the metal layer has thickness of from about 10 μm to about 50 μm, a characteristic impedance of from about 50 ohms to about 80 ohms will result. Layer 220 is a thinner organic material of thickness from about 5 microns to about 15 microns. Organic materials used to fabricate layer 220 can be selected from the group of other etchable, high temperature organics. Layer 220 is not attacked by etchants which etch layer 222.

Figure 32:
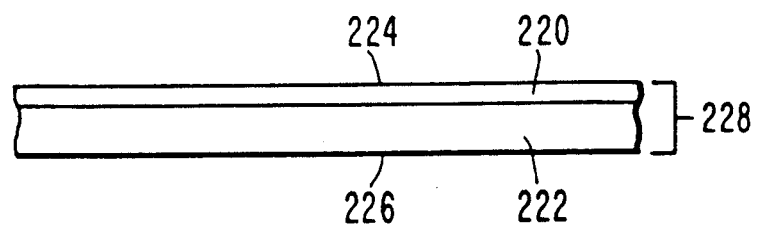
FIG. 32 to FIG. 40 schematically shows process to fabricate the structure of FIG. 31.
Figure 33:
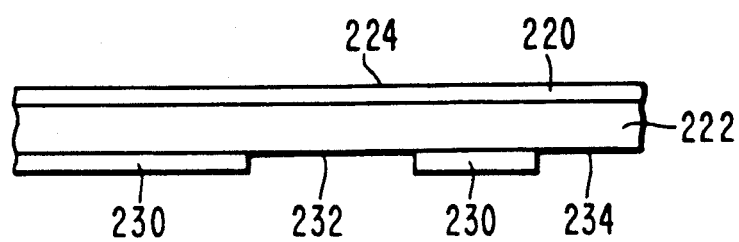

In FIG. 33, a resist-type material 230 is deposited on surface 226 of structure 228 of FIG. 32. By commonly used photolithographic techniques the resist type material is selectively exposed developed and patterned exposing surface 226 in regions 232 and 234.

Figure 34:
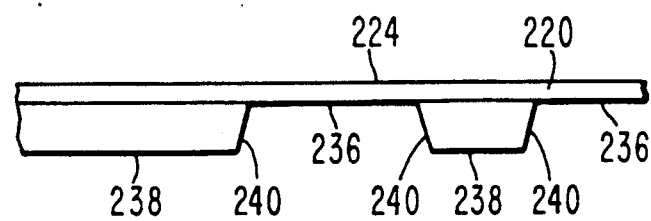

In FIG. 34 dielectric surface 226 is exposed to an etchant to remove polymer layer 222 in exposed regions 232 and 234. Any commonly known etch technique can be used, such as for example wet etching, RIE etching, ion milling, and laser ablation. These etch techniques are exemplary only and not limiting.

Figure 35:
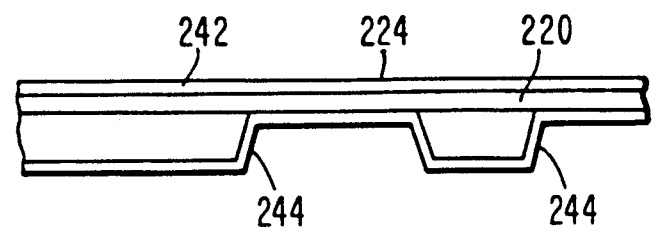

In FIG. 35 surfaces 224, 236, 238 and the sidewalls 240 of the patterned resist are coated with a blanket thin layer of metal such as a layer of Cu, Pd or other seed metal. These thin metal layers serve as a plating base. Any commonly known method of depositing a plating base can be used, such as for example sputter deposition, evaporation and chemical deposition processes wherein a seed layer is deposited by dipping the object to be seeded into a seeding solution. These methods of depositing a plating base are exemplary and not limiting.

A resist-type material can be deposited on both sides of the structure shown in FIG. 35. i.e., seed layer 242 and seed layer 244.

Figure 36:
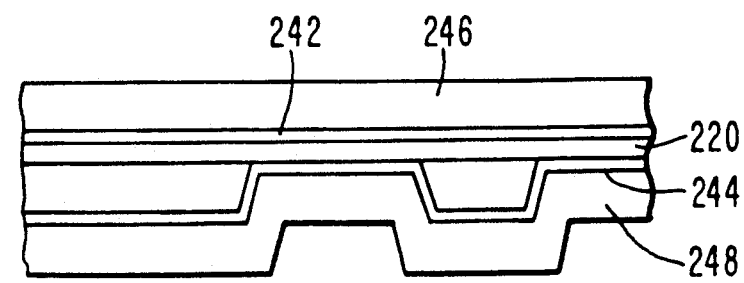

FIG. 36 shows a resist-type material 246 on seed layer 242 and a resist-type material 248 on seed layer 244.

Figure 37:
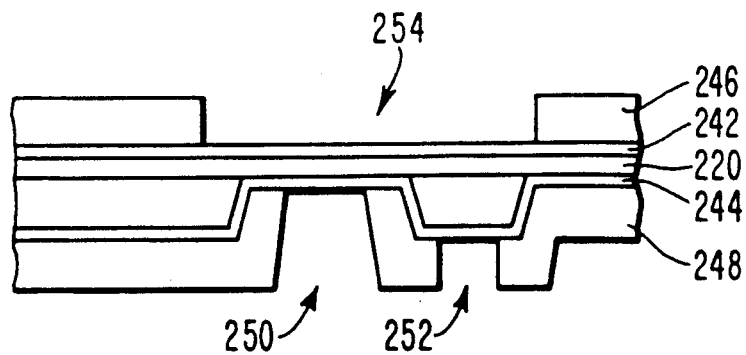

In FIG. 37 the resist type material 248 is selectively removed in regions 250 and 252 and resist-type material 246 is selectively removed in region 254. Resist layer 248 is on seed layer 244 which has a rough topography. If necessary more than one resist layer can be deposited on seed layer 244 to allow successful patterning of subsequent metal 258.

Figure 38:
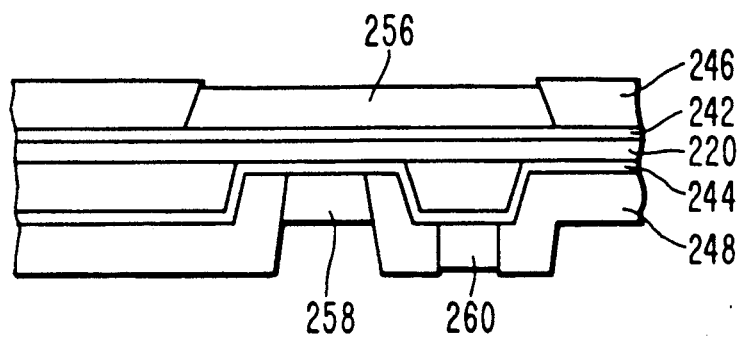

FIG. 38 shows metal 256 plated onto the seed layer 242 which is exposed in region 254 etched in resist-layer 246. Metal patterns 258 and 260 are plated onto exposed seed layer 244 in regions 250, 252 in resist layer 248 respectively. Since the plated thickness of a conductor plated onto seed layers 244 may be as high as 50 microns, it may be necessary to apply first a thin resist layer, e.g., KTFR, onto seed layer 244 which uniformly coats the surface and then a thicker resist-type material, e.g., RISTON, such as a dry-film which is commonly used to build up straight-walled patterns on thick layers. The metal plated into regions 254, 250 and 252 can be any electroplated or electrolessly plated metal such as Cu, Ni, Au, Ag, and alloys thereof. These metals are exemplary only and not limiting. The plated metal thickness can be as thick as 50 microns and thicker. The preferred metal thickness is from about 10 microns to about 40 microns.

Figure 39:
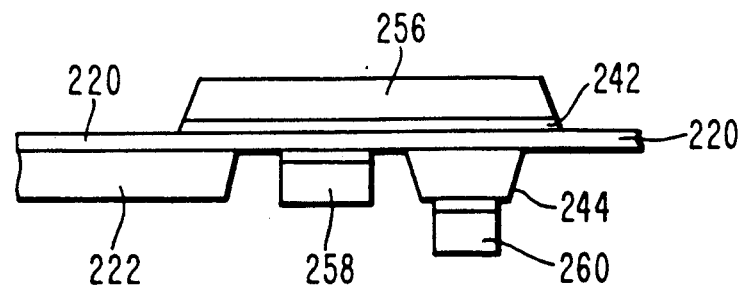

As shown in FIG. 39 the resist-type material layers 246 and 248 are removed from plating base 242 and 244 respectively. Thereafter the plating base layer 242 not beneath the metal layer 256 is removed by commonly used wet or dry etching techniques, and plating base layer 244 not beneath metal patterns 258 and 260 is removed.

Figure 40:
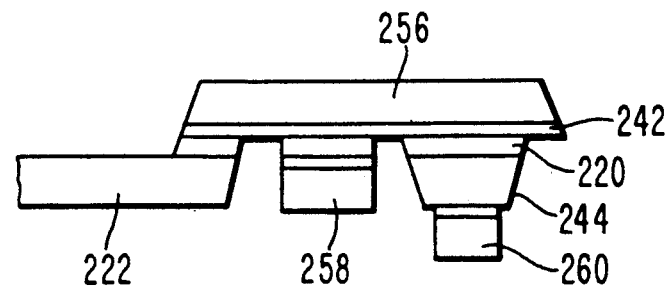

As shown in FIG. 40, in a final step, the exposed thin organic layer 220 is removed to form the apertures of the inner and outer lead bonding sites by a commonly known etch technique, such as, for example, wet etching, RIE and ion milling.

A variation of the process to fabricate the structure shown in FIG. 31 is to start with a dual dielectric layer having a thick metal layer on one side.

FIG. 41 to FIG. 46 shows another process sequence for achieving the structure shown in FIG. 31. This process uses a single material for the dielectric layer 204 of FIG. 31.

Figure 41:
FIG. 41 to FIG. 46 schematically shows another process to fabricate the structure of FIG. 31.

FIG. 41 shows a starting metal layer which is embossed, stamped, coined, or otherwise formed from a conductor such as Cu, Au, Ag, Mo, Ni and alloys thereof. This list is exemplary and not limiting.

Figure 42:
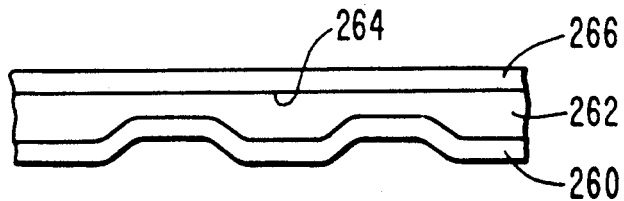
Figure 43:
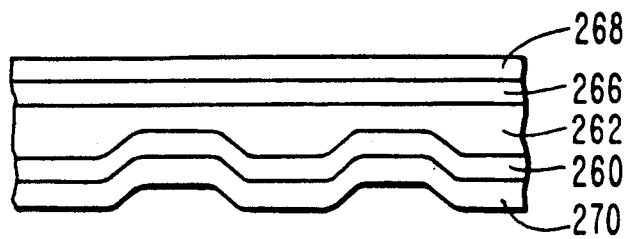

Referring to FIG. 42 a moldable dielectric layer 262 is disposed onto the embossed or formed layer 264, e.g., by spray or spin coating. Metal layer 266 is deposited on surface 264 of dielectric layer 262 for example by laminating layer 266 onto surface 264. Examples of metal layers 266 are Cu, Au, Ag, Ni, Mo and alloys thereof. An example of a moldable dielectric is polyimide 25, 25, manufactured by Dupont. Moldable dielectric layer 262 serves as an adhesive between metal layers 266 and 260. As shown in FIG. 43 a resist-like material 268 is deposited onto metal 266 and a resist-like material 270 is deposited onto metal layer 260. The resist type material can be a commonly used photoresist. Since shorting between metal layers may be a problem, a thin organic layer, which is bonded to the planar metal layer 266, may be used to ensure separation of metal layers 266 and 260.

Figure 44:
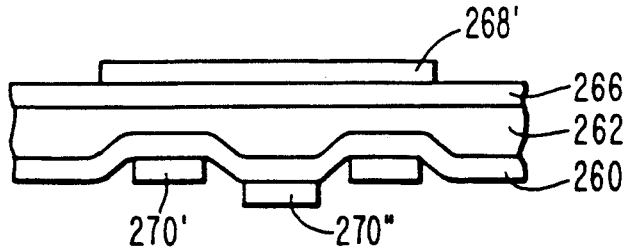

As shown in FIG. 44 the resist-like material layers 268 and 270 are selectively removed. The process of development and removal of the resist type material are commonly known in the art. After selective removal region 268' is left from resist 268 on metal layer 266 and regions 270' and 270" are left of resist 270 on metal layer 260.

Figure 45:
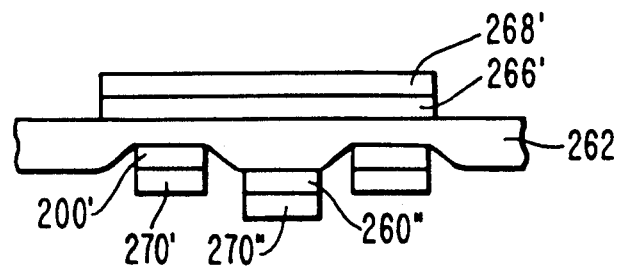

As shown in FIG. 45 metal 266 not under resist region 268' and metal 260 not under resist regions 270' and 270" are removed by etching away excess metal layers 266 and 260 leaving metal regions 266', 260' and 260". The excess metal in layers 260 and 266 can be etched by commonly used wet etching, RIE etching, ion milling and the like. These removal processes are exemplary only and not limiting. Any suitable removal process can be used.

Figure 46:
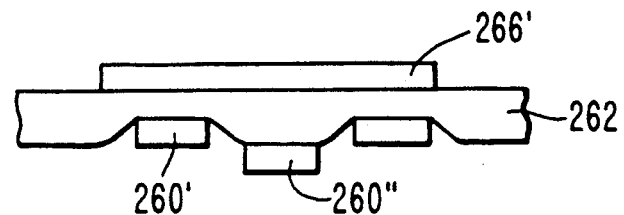

In FIG. 46 the remaining resist-type material regions 268', 270' and 270" are removed leaving a structure having two metal layers and a variable thickness dielectric between the two metal layers.

Figure 47:
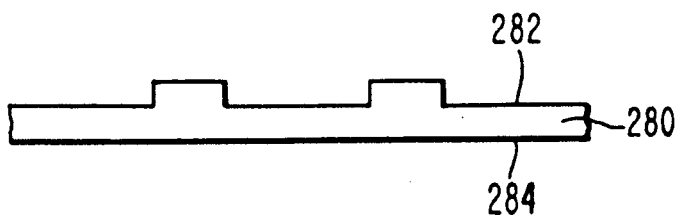
FIG. 47 to 49 schematically shows another process to fabricate the structure of FIG. 31.
Figure 48:
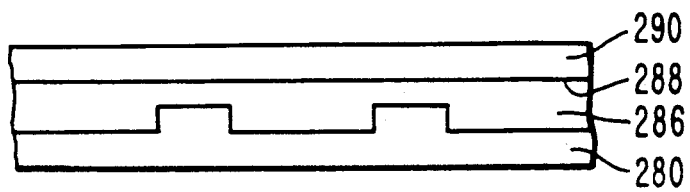
Figure 49:
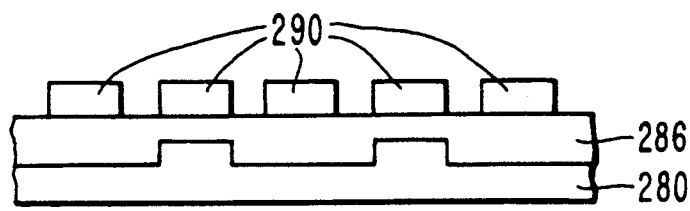

FIG. 47 to FIG. 49 shows another process sequence to fabricate the structure shown in FIG. 31. This process uses a variable thickness metal layer prepared by selective plating of a metal onto a planar metal layer. The planar metal layer can be Cu, Au, Ag, Ni, Mo and alloys thereof. This list is exemplary only and not limiting. By commonly known methods metals such as Cu, Au, Ag, Ni and Mo and the like can be selectively plated onto the planar metal layer. Alternatively a planar metal layer can be selectively etched by commonly known methods to form a variable thickness metal layer.

FIG. 47 shows a variable thickness conducting layer 280 which is either etched or pattern plated.

A thick 50 to 100 micron moldable dielectric layer 286 is laminated onto patterned surface 282 of conductive layer 280. A second conducting layer 290 is laminated to side 288 of moldable dielectric 286.

The metal layers 290 and 280 can be selectively etched in a similar fashion as described above with reference to FIG. 41 to FIG. 46.

FIG. 49 shows conducting layer 290 selectively removed resulting in a two metal layer structure having a variable thickness dielectric 286 there between. It will be apparent to one of ordinary skill in the art that the process described to achieve a variable thickness dielectric can be appropriately modified to achieve the desired local thickness of the dielectric. The variation in dielectric thickness is not limited to a selection between two thicknesses. Although FIG. 31 shows two thicknesses in dielectric layer 204, the processing can be appropriately modified to have any number of dielectric thicknesses. The desired characteristic impedance of a conductor can be achieved by selecting an appropriate local dielectric thickness conductor width and conductor thickness.

Another general approach for fabricating the variable impedance structure is the bonding of two independently prepared TAB tapes. This requires rather tight alignment tolerances for many of the desired structures. However, for others this may be the preferred method of fabrication. The structure shown in FIG. 31 can be implemented using the via structure of FIG. 7 or the structures without vias shown in FIG. 8.

It will be apparent to these of ordinary skill in the art that structures having more than two conducting layers with a variable thickness dielectric between adjacent conducting layers can be achieved by a generallization of the above processes. In a multi metal layer structure having a variable thickness dielectric between adjacent metal layers, decoupling capacitors can be fabricated to decouple power, signal and ground leads. For example, in a two metal layer structure, one metal layer can provide signal and power beam leads and the other metal layer can provide a ground plane. At some location on the structure, a power lead can be expanded to provide a large surface for a capacitor electrode. On the ground plane layer a corresponding large metal area can be formed for the second capacitor electrode. The dielectric thickness between the two electrodes can be made as thin as possible to result in a large capacitance between the two electrodes, thereby forming a decoupling capacitor between the power lead and ground plane.

Figure 50:
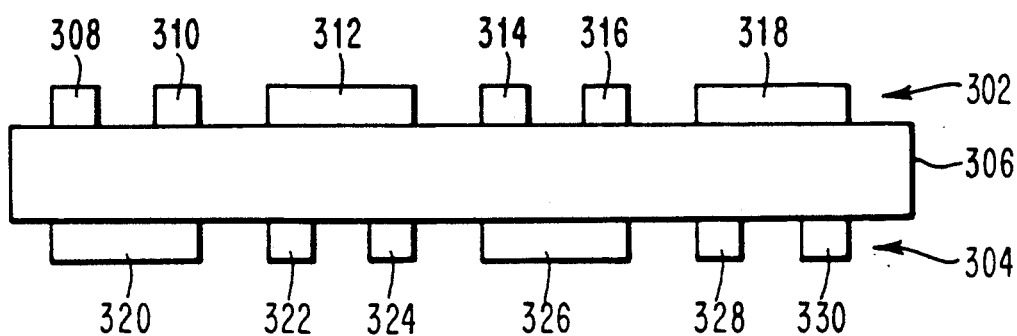
FIG. 50 diagramatically shows a cross section of a TAB tape having two levels of metallization wherein signal leads are dispersed adjacent a voltage and ground lead.

In general as integrated circuit (IC) densities increase, there is an increased need for signal I/0 as well as a desire to switch more and more off-chip-drivers (OCDs) simultaneously. The number of simultaneously switching OCDs that can be permitted in a given IC package is limited by noise considerations. One method that can be used to increase the number of allowable simultaneously switching OCDs is to use a large fraction of the total package leads to supply power to the IC. This method is usually inefficient relative to the trade-offs between the total number of leads available, the number of signal I/O required and the high cost of packages with additional leads. An invention shown in FIG. 50 shows a structure applicable to most IC packaging technologies. The package has at least two metal layers. A triplate structure is realized by interleaving voltage and ground leads in such a way that a signal lead is always above or nearly above a voltage lead and adjacent a ground lead or vice versa.

FIG. 50 is a cross section through a two layer metallurgical structure similar to those shown in FIG. 4 and FIG. 8 along the line G—G and H—H respectively. The arrangement of conductors in FIG. 50 is not the same as shown in FIG. 4 and FIG. 8.

FIG. 50 shows conductor layers 302 and 304 with dielectric layer 306 therebetween. Layer 302 has a plurality of conductors 308, 310, 312, 314, 316 and 318 having a sequence signal, signal, ground, signal, signal and ground respectively. Layer 304 has a plurality of conductors 320, 322, 324, 326, 328 and 330 having a sequence voltage, signal, signal, voltage, signal, signal respectively. The specific example of FIG. 50 is exemplary only and not limiting.

FIG. 50 shows two signal leads between ground leads on layer 302 and two signal leads between voltage leads on layer 304. Therefore, each signal lead is adjacent to a voltage and ground lead. There can be one signal lead between ground leads and between voltage leads, for each signal lead to be adjacent to a ground and power lead. The structure of FIG. 50 can be fabricated in a TAB tape technology to provide impedance with a range of 40–80 ohms. An exemplary polyimide dielectric thickness to achieve this is from 0.8 to 2.4 mils.

For each signal line the nearby voltage and ground lines provide a return path for current thus reducing the effective power inductance of the package. In addition the interspersed power leads provide effective isolation of pairs of signal leads from each other, thus reducing the coupled noise in the package. When two signal lines are placed between the ground or voltage leads, the signal lines are spaced according to the desired impedance. The spacings of adjacent signal lines, the thickness of dielectric 306, the width of ground and power leads can be adjusted to achieve various levels of performance.

When signal lines are symetrically spaced between ground and voltage lines as shown in FIG. 50 a balanced system is achieved. A signal line which provides an input signal to a circuit shifting current flow from ground to voltage lead or vice versa will see about the same impedance. A balanced impedance is desirable when a signal lead is an input to a commonly used push-pull off-chip driver. In a push pull driver circuit the voltage level at a signal input determines whether current is drawn from ground or the voltage supply. When the voltage at the input is changed to a pre-determined value the current swings from the ground to voltage supply or from the voltage supply to ground. A CMOS push-pull driver typically has a 5 volt swing. This balanced design leads to a more noise controlled system where the effect of high simultaneous switching activity on circuit delay is minimized. Moreover, the overlapping of voltage and power leads provides a low impedance power supply network and also provides additional comparative decoupling of the voltage supply.

The structure of FIG. 50 has particular advantage in FET type technology.

The high-speed off-chip drivers used in high performance VLSI pose a particular problem for the package design engineer due to their high slew rates and associated large current rate of change (dI/dt). The high slew rate leads to increased cross talk while the large dI/dt leads to inductive noise (known as delta-I noise). The delta-I noise arises because of the inductive nature of the power supply network which provides current to the off-chip drivers: $\Delta V = L \, dI/dt$.

The problem of delta-I noise is somewhat different in bipolar and CMOS technologies due to their different current switch behavior. In present bipolar technologies current is drawn from the supply continuously and the current is "steered" by the transistors in order to switch states. In CMOS technology there is very little continuous current demand and current is turned on and off in order to charge capacitive nodes in the circuits. These differences suggest that separate approaches could be used to solve the delta-I noise problem.

It is known that in modules used for packaging high speed integrated circuits the problem of electrical cross talk can be reduced by the introduction of a conducting plane in close proximity to the parallel signal lines. This plane is usually referenced to ground for maximal effect and is referred to as a ground plane. In addition to reducing crosstalk, the ground plane can serve as a current return path and as the ground reference for the signal transmission lines. In present multilayer packages, the ground plane is formed by a solid plane or a mesh plane and is connected to the printed circuit card ground through a limited number of pins. Similar structures are utilized in the power cores for cards and boards.

A figure-of-merit usually associated with the delta-I noise problem is the effective power inductance of the module. The effective power inductance represents the short circuit loop inductance looking back into a perfectly decoupled power supply. It is derived by summing the self-inductance of the current paths in the supply and return legs of the power net and subtracting the mutual inductance between these paths. In conventional modules the designer attempts to minimize the self-inductance of the power supply and return legs of the power net and maximize their mutual inductance. This leads to the lowest effective inductance and the lead delta-I noise for bipolar circuits.

In the case of CMOS circuitry, the lack of a current path directly from the supply leg to the return leg of the power supply eliminates the effect of the supply-return mutual inductance and increases the effect of delta-I noise over bipolar circuits for the same dI/dt. This means that the usual figure of merit defined above is not applicable to the delta-I noise problem in CMOS. For CMOS circuits there are two separate but important current paths to be considered. Assuming a positive power supply, these are:

1. From the positive supply through the appropriate signal line to the load capacitance for an upgoing signal transition.

2. From the positive side of the load capacitance through a signal line and the ground leg of the net back to the power supply for a downward going transition.

Thus it can be seen that for CMOS there are two inductances that are relevant to the delta-I noise problem: the effective inductance of the signal line-Vdd power loop and the effective inductance of the signal line-ground power loop.

In order to minimize delta-I noise in CMOS circuitry, one would like to minimize the self-inductances of the supply and return legs of the supply net as well as the self-inductance of the signal lines and increase the mutual inductances between the signal lines and the supply leg and the signal lines and the return leg.

This structure of FIG. 50 provides the minimum electrical discontinuity between chip and the second level package, thus minimizing the effects of coupled noise and reducing electromagnetic interference. The supporting second level being then utilized for random signal wiring in more favorable geometries and dielectrics when compared to current "state-of-the-art" first level concepts, practice and development thrusts; which are based on multilayer/via wiring geometries and structures. Further, while applicable to existing second level practice which is also based on multilayer/via wiring geometries, it is even more applicable to the emerging multiwire second level technology where the shorter effective "shielded" electrical paths can be obtained between first level package and second level along with a minimum electrical discontinuity. The new technology uses a micro-coax to make interconnections in the card. In present practice much of the advantage of this technology is lost when signals are interconnected through the first level package. The structure of FIG. 50 allows one to maintain the controlled impedance signal environment right up to the edge of the chip. When the structure of FIG. 50 is fabricated on a TAB type tape the utilization of test contacts permits testing to be carried out in a reel-to-reel format and if combined with boundary scan (self-test) will permit "burn-in" in a reel-to-reel mode. These test contacts are discarded when the package is excised. These features are options not essential to the base invention and are included as illustrations of the invention's manufacturing flexibility.

When an IC is electrically connected to a board by a TAB type lead frame having the structure of FIG. 48 the relationship to the second level packaging card or board needed to support the simultaneous switching in effect moves the random signal redistribution from the ceramic first level package into the card or board thus capitalizing on the improved dielectric inherent in the card material. Further improvement is realized by moving from a pinned to surface solder structure. It should be noted that this is counter to the current development and system thrusts which effectively "float" a low dielectric redistribution on a ceramic structure.

It is to be understood that the above described embodiments are simply illustrative of the principles of the invention. Various other modifications and changes may be devised by those skilled in the art which will embody the principles of the invention and fall within the spirit and scope thereof.

Having thus described the invention, what we claim as new and desire to secure by Letters Patent is:

1. A structure comprising:
   at least one dielectrical layer having disposed on both sides thereof a plurality of electrically conducting beam leads;
   said at least one dielectric layer having an edge;
   at least one of said electrically conducting beam leads having an end cantilevered from said edge;
   said dielectrical layer having a non-uniform thickness providing a dielectric of varied thickness between said electrically conducting leads disposed on said both sides of said at least one dielectric layer; and
   at least part of said electrically conducting beam leads being oppositely disposed on either side of said dielectric layer to form a plurality of pairs of beam leads, there being at least one of said plurality of pairs having a first thickness of said dielectric layer therebetween, there being at least another of said plurality of pairs of beam leads having a second thickness of said dielectric layer therebetween.

2. A structure comprising:
   at least one dielectric layer having disposed on both sides thereof a plurality of electrically conducting beam leads;
   a central aperture in said dielectric layer, said aperture having an edge;
   at least two of said electrically conducting beam leads on different sides of said at least one dielectric layer have an inner end cantilevered from said edge into said central aperture;
   said at least one dielectric layer having a non-uniform thickness providing a dielectric of varied thickness between said conducting leads disposed on said both sides of said at least one dielectric layer,
   at least part of said electric conducting beam leads being oppositely disposed on either side of said dielectric layer to form a plurality of pairs of beam leads, there being at least one of said plurality of pairs having a first thickness of said dielectric layer therebetween, there being at least another of said plurality of pairs of beam leads having a second thickness of said dielectric layer therebetween; and said inner ends of said beam leads substantially lying in the same plane.

3. The structure of claim 1, further including at least one electronic device having at least one contact location thereon electrically connected to said inner end of at least one of said beam leads.

4. The structure of claim 1, wherein said dielectric layer is flexible.

5. The structure of claim 3, wherein at least one of said beam leads has an outer end which projects outwardly in cantilevered fashion over an outer edge of said dielectric layers.

6. The structure of claim 5, further including a substrate having at least one contact location thereon electrically connected to said outer end of said at least one outwardly projecting beam lead.

7. The structure of claim 3, wherein at least two of said electrically conducting beam leads from different sides of said at least one dielectric layer have outer ends cantilevered over an outer edge of said dielectric layer, said outer ends substantially lying in the same plane.

8. A structure comprising:
at least one dielectric layer having disposed on both sides thereof a plurality of electrically conducting beam leads;
an aperture in said dielectric layer, said aperture having an edge,
at least two of said electrically conducting beam lead have inner ends cantilevered from said edge of said aperture;
said at least one dielectric layer having a non-uniform thickness providing a dielectric of varied thickness between said conducting leads disposed on said both sides of said dielectric layer;
at least part of said electric conducting beam leads being oppositely disposed on either side of said dielectric layer to form a plurality of pairs of beam leads, there being at least one of said plurality of pairs having a first thickness of said dielectric layers therebetween, there being at least another of said plurality of pairs of beam leads having a second thickness of said dielectric layer therebetween;
at least one electronic device having contact locations on a major surface, said contact locations being electrically connected to said inner ends of said beam leads;
said at least one dielectric layer having an outer edge;
at least two of said electrically conducting beam leads have outer ends cantilevered from said outer edge of said at least one dielectric layer, said outer ends substantially lying in the same plane; and
a substrate having contact location thereon electrically connected to said outer ends of said outwardly projecting beam leads.

9. A structure comprising:
a flexible tape having at least one flexible dielectric layer having a plurality of electrically conducting beam leads disposed on both sides thereof;
a plurality of beam lead sets formed in said tape from said plurality of electrically conducting beam leads;
at each of said sets, there being a central aperture in said at least one dielectrical layers, said aperture having an edge;
said at least one dielectric layer having a non-uniform thickness providing a dielectric of varied thickness between said conducting leads disposed on said both sides of said at least one flexible dielectric layer;
at each of said sets, at least two of said electrically conducting leads have inner ends cantilevered over said edge into said central aperture;
at least part of said electrically conducting beam leads at each of said sets oppositely disposed on either side of said at least one flexible dielectric layer to form a plurality of pairs of beam leads, there being at least one of said plurality of pairs having a first thickness of said dielectric layer therebetween, there being at least another of said plurality of pairs of beam leads having a second thickness of said dielectric layer therebetween;
at each of said sets, said inner ends of said beam leads projecting into said central aperture substantially lying the same plane.

10. The structure of claim 9, further including at least one electronic device having at least one contact location thereon electrically connected to said inner ends of at least one of said beam leads at each of said sets.

11. A structure comprising:
at least one dielectric layer having disposed on both sides thereof a plurality of electrically conducting beam leads;
said at least one dielectric layer having an edge;
at least one of said electrically conducting leads having an end cantilevered from said edge;
a first portion of said plurality of beam leads being electrically grounded, a second portion of said plurality of beam leads being power leads and a third portion of said plurality of beam leads being signal leads; and
on one of said sides of said at least one dielectric layer there being at least one signal lead which is next to a lead selected from a ground and a power lead and said at least one signal lead being opposite to the other of a ground and power lead on; which is on the other side of said at least one dielectric layeroff.

12. A structure comprising:
at least one dielectric layer having disposed on both sides thereof a plurality of electrically conducting beam leads;
an aperture in said at least one dielectric layer, said aperture having an edge;
at least two of said electrically conducting beam lead having an inner end cantilevered from said edge of said aperture;
a first portion of said beam leads being electrically grounded, a second portion of said beam leads being power leads and a third portion of said beam leads being signal leads
on one of said sides of at least one dielectric layer there being at least one signal lead which is next to a lead selected from one of a ground and power lead, and said at least one signal lead being opposite to the other of a ground and power lead which is on the other side of said at least one dielectric layer; and
the inner ends of said beam leads substantially lying in the same plane.

13. The structure of claim 12, further including at least one electronic device having at least one contact location thereon electrically connected to said inner end of said at least one of said beam leads.

14. The structure of claim 13, wherein said electronic device contains at least one electronic circuit having at least a signal, a voltage and a ground input, each electrically connected to one of said at least one contact locations, said at least one signal lead, said ground lead and said power lead being electrically connected to said signal input, said ground input and said voltage input, respectively, said circuit having the property that when a voltage is applied at a first predetermined value at said signal input, current is drawn between said ground input and said signal input and when a voltage is applied at a second predetermined value at said signal input, current is drawn between said voltage input and said signal input.

15. The structure of claim 12, wherein said dielectric layer is flexible.

16. The structure of claim 13, wherein said at least one beam lead has one outer end which projects outwardly in cantilevered fashion over an outer edge of said dielectric layer.

17. The structure of claim 16, further including a substrate having at least one contact location thereon electrically connected to said outer end of said at least one outwardly projecting beam lead.

18. The structure of claim 13, wherein at least two of said electrically conducting beam leads have an outer end cantilevered fashion an outer edge of said dielectric layer, said outer ends of said outwardly projecting beam leads substantially lying in the same plane.

19. A structure comprising:
at least one dielectric layer having disposed on both sides thereof a plurality of electrically conducting beam leads;
a central aperture in said at least one dielectric layer, said aperture having an edge;
at least two of said electrically conducting beam leads having inner ends cantilevered from said edge into said central aperture;
a first portion of said beam leads being electrically grounded, a second portion of said beam leads being power leads and a third portion of said beam leads being signal leads;
on one of said sides of said at least one dielectric layer there being at least one signal lead which is next to a lead selected from a ground and power lead and said at least one signal lead being opposite to the other of a ground and power lead which is on the other side of said at least one dielectric layer;
at least one electronic device having contact locations on a major surface, said contact locations being electrically connected to said inner ends of said beam leads;
said electronic device contains at least one electronic circuit having at least a signal, a voltage and a ground input, each electrically connected to one of said at least one contact locations, said at least one signal lead, said ground lead and said power lead being electrically connected to said signal input, said ground input and said power input respectively, said circuit having the property that when a voltage is applied at a first pre-determined value at said signal input, current is drawn between said ground input and said signal input and when a voltage is applied at a second pre-determined value at said signal input, current is drawn between said voltage input and said signal input;
at least two of said electrically conducting beam lead having an outer end cantilevered from an outer edge of said at least one dielectric layer; and
a substrate having contact locations thereon electrically connected to said outer end of said outwardly projecting beam leads.

20. A structure comprising:
a flexible tape having at least one flexible dielectric layer having a plurality of electrically conducting beam leads disposed on both sides thereof;
a plurality of beam lead sets formed in said tape from said plurality of electrically conducting beam leads;
at each of said sets, there being a central aperture in said at least one dielectric layer, said aperture has an edge;
at each of said sets, there being at least one conducting beam lead having an inner end cantilevered from said edge into said central aperture;
at each of said sets, a first portion of said beam leads being electrically grounded, a second portion of said beam leads being power leads and a third portion of said beam leads being signal leads; and
at each of said sets on one of said sides of said at least one dielectric layer there being at least one signal lead which is next to a lead selected from a ground and power lead and said at least one signal lead being opposite to the other of a ground and power lead which is on the other side of said at least one dielectric layer.

21. The structure of claim 20, further including at least one electronic device having at least one contact location thereon electrically connected to the inner end of at least one of said beam leads at each of said sets.

22. A structure comprising:
at least one dielectric layer having disposed on both sides thereof a plurality of electrically conducting beam leads;
a central aperture in said dielectric layer, said aperture having an edge;
at least one of said pluralities of conducting beam lead having an inner end cantilevered from said edge into said central aperture;
said at least one dielectric layer having a non-uniform thickness providing a dielectric of varied thickness between said conducting leads disposed on said both sides of said at least one dielectric layer
at least part of said electric conducting beam leads being oppositely disposed on either side of said dielectric layer to form a plurality of pairs of beam leads, there being at least one of said plurality of pairs having a first thickness of said dielectric layers there between, there being at least another of said plurality of pairs of beam leads having a second thickness of said dielectric layer there between;
a first portion of said plurality of beam leads being electrically grounded, a second portion of said plurality of beam leads being power leads and a third portion of said plurality of beam leads being signal leads; and
on one of said sides of said at least one dielectric layer there being at least a signal lead which is next to a lead selected from a ground and power lead and said at least one signal lead being opposite to the other of a ground and power lead which is on the other side of said at least one dielectric layer.

23. A structure comprising;
- a flexible tape having at least one flexible dielectric layer having disposed on both sides thereof a plurality of electrically conducting beam leads;
- a plurality of beam lead sets formed in said tape from said plurality of electrically conducting beam leads;
- at each of said sets, there being a central aperture in said at least one dielectric layer, said aperture having an edge;
- at each of said sets, there being at least one conducting beam lead having an inner and cantilevered from said edge into said central aperture;
- said at least one dielectric layer having a non-uniform thickness providing a thickness dielectric of varied thickness between conducting leads disposed on said both sides of said at least one dielectric layer;
- at each of said sets a first portion of said plurality of beam leads being electrically grounded, a second portion of said plurality of beam leads being power leads and a third portion of said plurality of beam leads being signal leads;
- at each of said sets, at least part of said electric conducting beam leads being oppositely disposed on either side of said dielectrical layer to form a plurality of pairs of beam leads, there being at least one of said plurality of pairs having a first thickness of said dielectrical layer there between, there being at least another of said plurality of pairs of beam leads having a second thickness of said dielectric layer there between;
- on one of said sides of said at least one dielectric layer there being at least one signal lead which is next to a lead selected from a ground and power lead and said at least one signal lead being opposite to the other of a ground and power lead which is on the other side of said at least one dielectric layer.

24. The structure of claim 23, further including at least one electronic device having at least one contact location thereon electrically connected to said inner end of at least one of said beam leads at each of said sets.

* * * * *